United States Patent
Yokoyama

(10) Patent No.: US 12,279,409 B2
(45) Date of Patent: Apr. 15, 2025

(54) ARRAY OF CAPACITORS AND METHOD USED IN FORMING AN ARRAY OF CAPACITORS

(71) Applicant: Micron Technology, Inc., Boise, ID (US)

(72) Inventor: Yuichi Yokoyama, Boise, ID (US)

(73) Assignee: Micron Technology, Inc., Boise, ID (US)

(*) Notice: Subject to any disclaimer, the term of this patent is extended or adjusted under 35 U.S.C. 154(b) by 170 days.

(21) Appl. No.: 17/696,160

(22) Filed: Mar. 16, 2022

(65) Prior Publication Data

US 2022/0208771 A1 Jun. 30, 2022

Related U.S. Application Data

(62) Division of application No. 16/935,634, filed on Jul. 22, 2020, now Pat. No. 11,309,314.

(51) Int. Cl.
*H10B 12/00* (2023.01)
*H01L 27/01* (2006.01)

(52) U.S. Cl.
CPC ........... *H10B 12/033* (2023.02); *H01L 27/01* (2013.01); *H10B 12/315* (2023.02)

(58) Field of Classification Search
None
See application file for complete search history.

(56) References Cited

U.S. PATENT DOCUMENTS

| | | | |
|---|---|---|---|
| 7,544,563 B2 | 6/2009 | Manning | |
| 10,312,241 B1 | 6/2019 | Yokoyama | |
| 2006/0261440 A1 | 11/2006 | Manning | |
| 2008/0042182 A1 | 2/2008 | Park | |
| 2021/0296322 A1* | 9/2021 | Lee | H01L 28/90 |

FOREIGN PATENT DOCUMENTS

WO    WO-2014057848 A1 *    4/2014    ....... H01L 27/10814

* cited by examiner

*Primary Examiner* — Steven M Christopher
(74) *Attorney, Agent, or Firm* — Wells St. John P.S.

(57) ABSTRACT

A method used in forming an array of capacitors comprises forming an array of vertically-elongated first capacitor electrodes that project vertically relative to an outer surface. An insulative ring is formed circumferentially about individual vertically-projecting portions of the first capacitor electrodes. The insulative rings about immediately-adjacent of the first capacitor electrodes in a first straight-line direction are laterally directly against one another. The insulative rings about immediately-adjacent of the first capacitor electrodes in a second straight-line direction that is angled relative to the first straight-line direction are laterally-spaced from one another. A capacitor insulator is formed over sidewalls of the first capacitor electrodes. At least one second capacitor electrode is formed over the capacitor insulator. Additional methods, including structure independent of method, are disclosed.

13 Claims, 52 Drawing Sheets

ARRAY OF CAPACITORS AND METHOD USED IN FORMING AN ARRAY OF CAPACITORS

RELATED PATENT DATA

This patent resulted from a divisional application of U.S. patent application Ser. No. 16/935,634, filed Jul. 22, 2020, entitled "An Array Of Capacitors And Method Used In Forming An Array Of Capacitors", naming Yuichi Yokoyama as inventor, the disclosure of which is incorporated by reference.

TECHNICAL FIELD

Embodiments disclosed herein pertain to arrays of capacitors and to methods used in forming an array of capacitors.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines, gatelines, or gate lines). The digitlines may conductively interconnect memory cells along columns of the array, and the access lines may conductively interconnect memory cells along rows of the array. Each memory cell may be uniquely addressed through the combination of a digitline and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1. In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. Other programmable materials may be used as a capacitor insulator to render capacitors non-volatile.

A field effect transistor is another type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate. Regardless, the gate insulator may be programmable, for example being ferroelectric.

Capacitors and transistors may of course be used in integrated circuitry other than memory circuitry.

DETAILED DESCRIPTION OF EXAMPLE EMBODIMENTS

Figure 1:
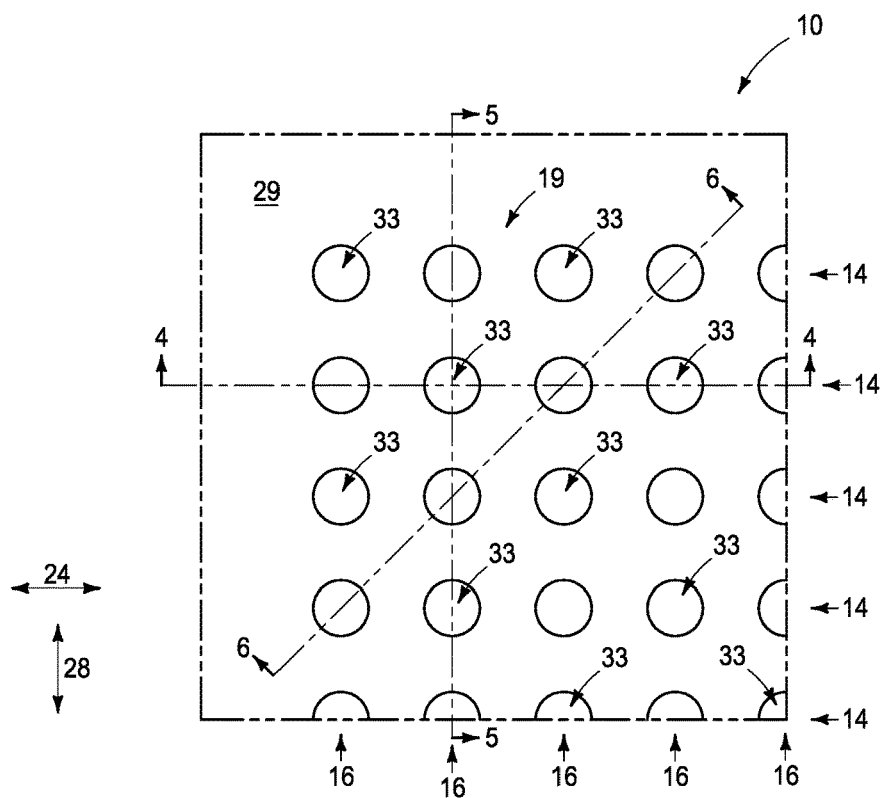
FIG. 1 is a diagrammatic cross-sectional view of a portion of a substrate in process in accordance with an embodiment of the invention.
Figure 2:
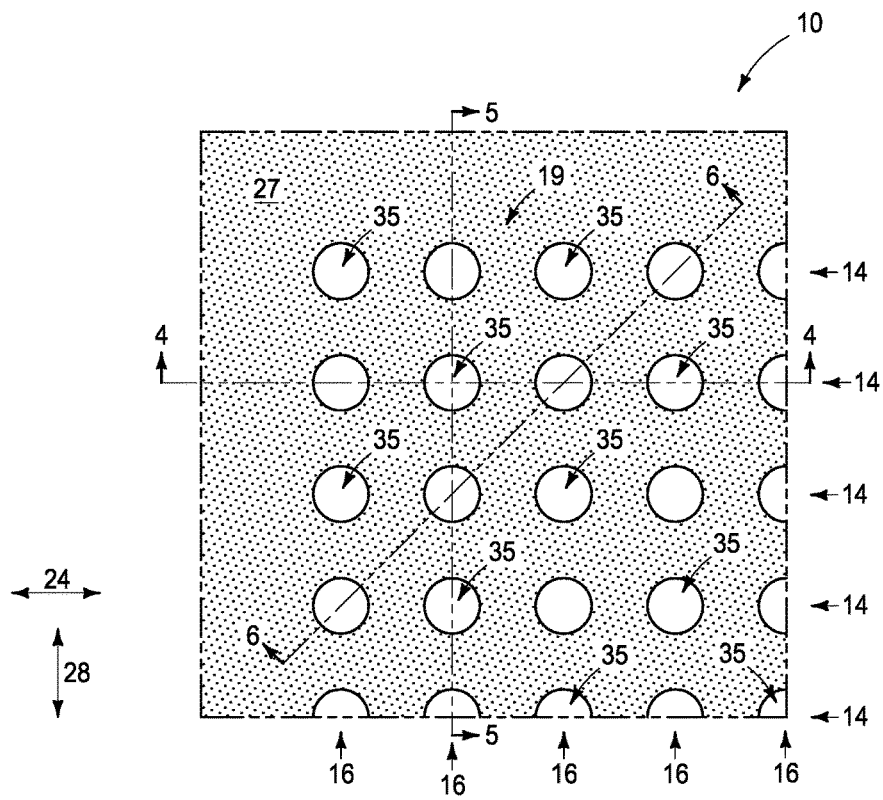
FIGS. 2-6 are cross-sectional views related to the FIG. 1 construction.
Figure 3:
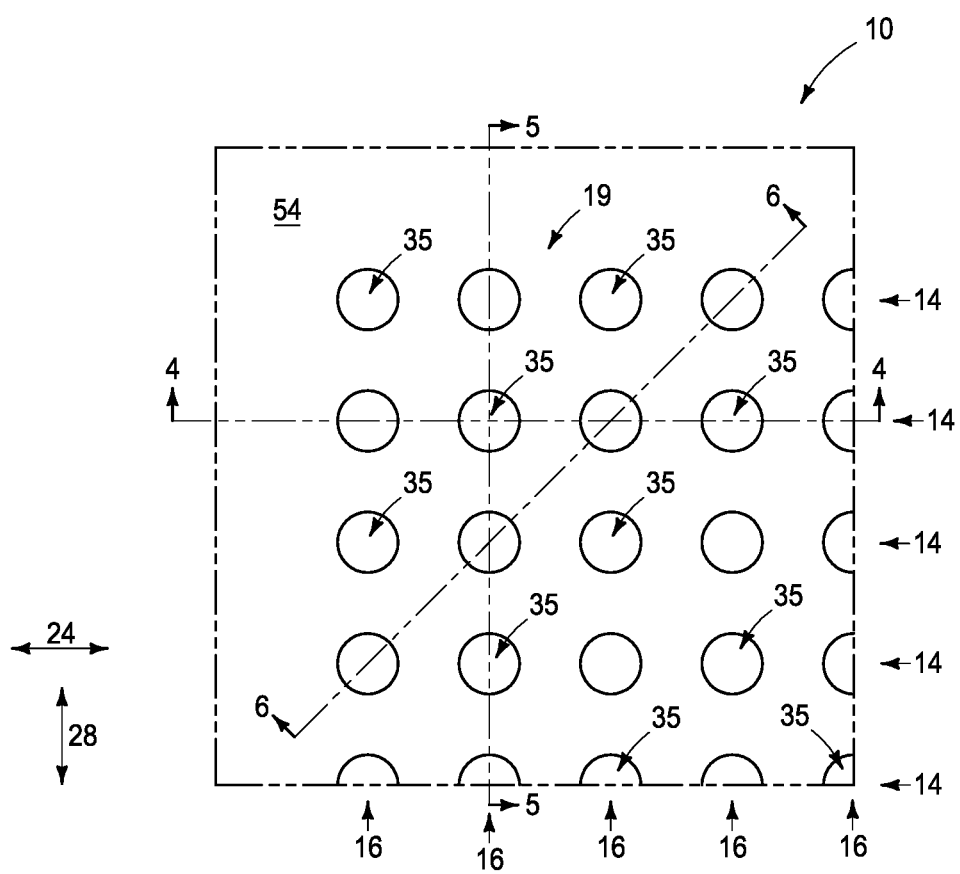
Figure 4:
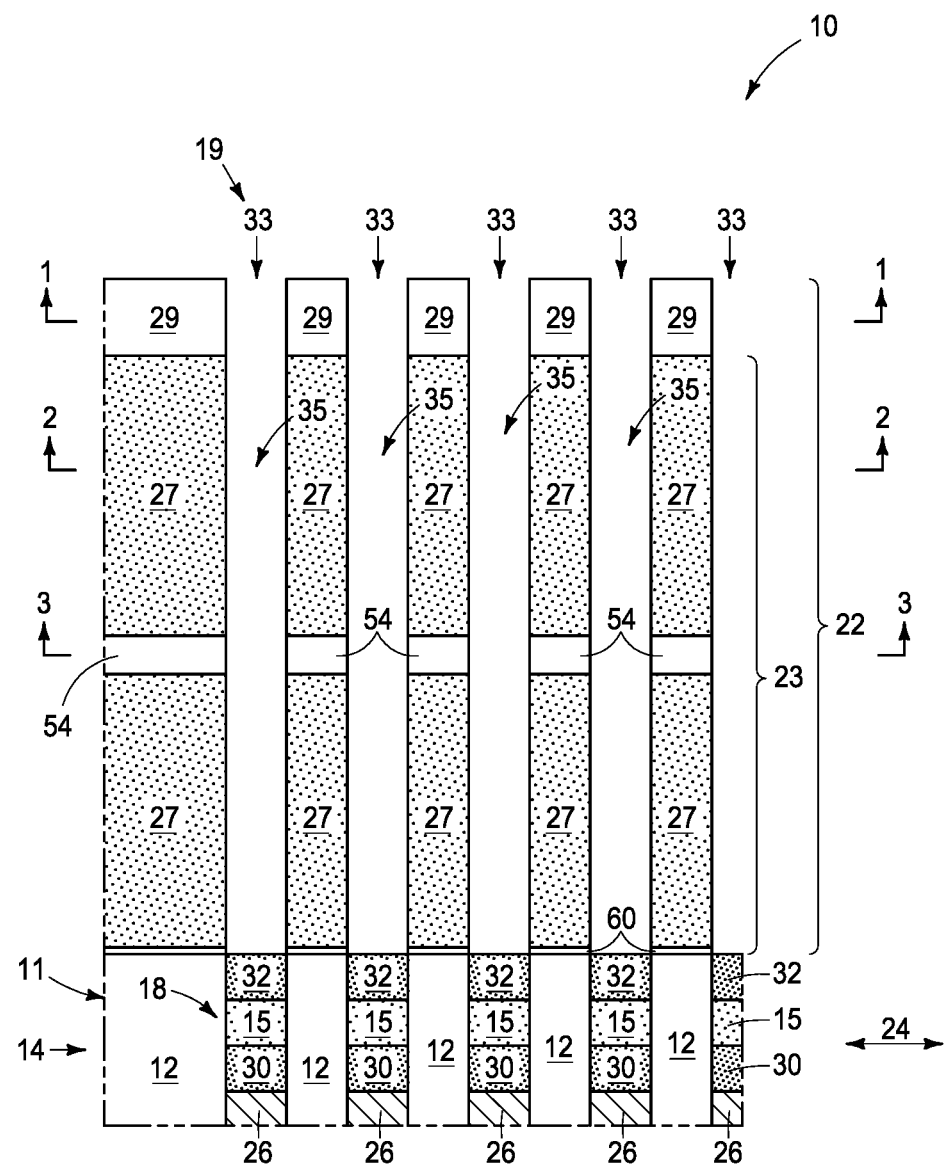
Figure 5:
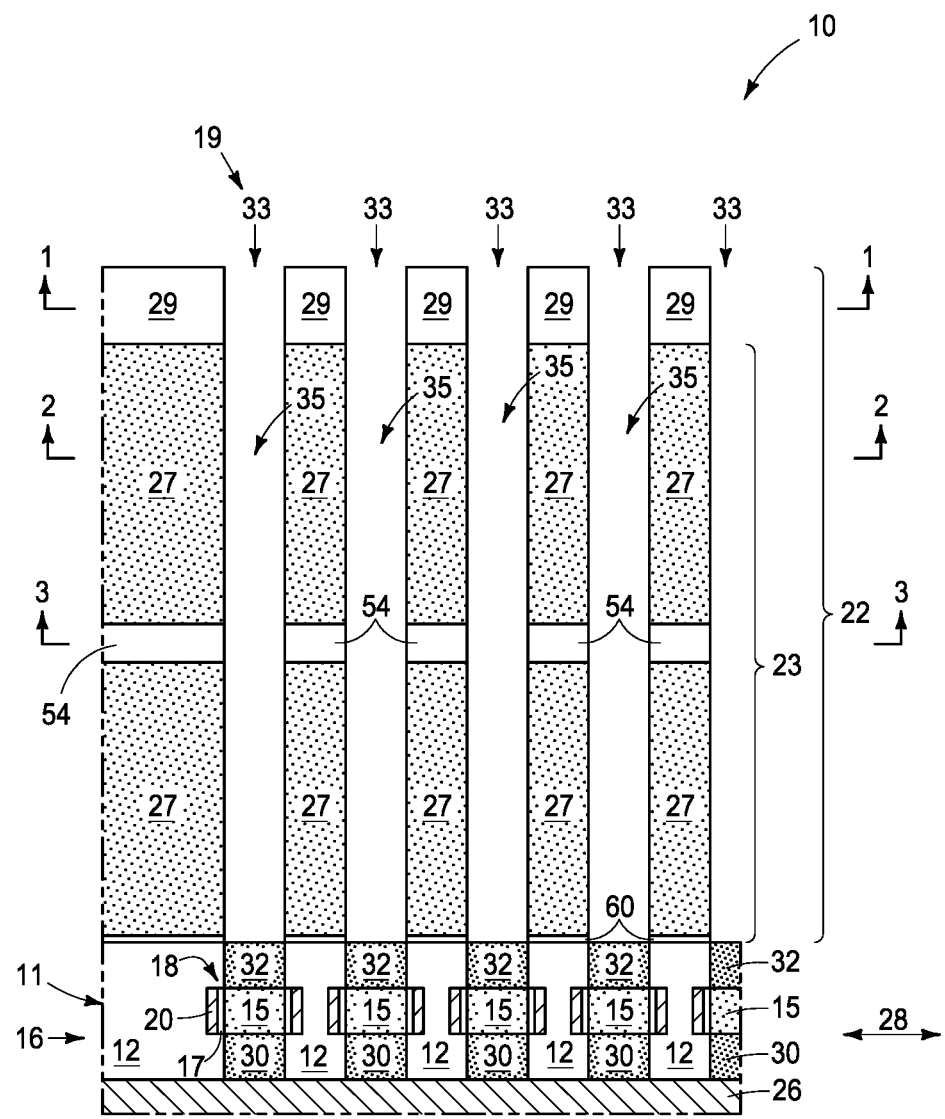
Figure 6:
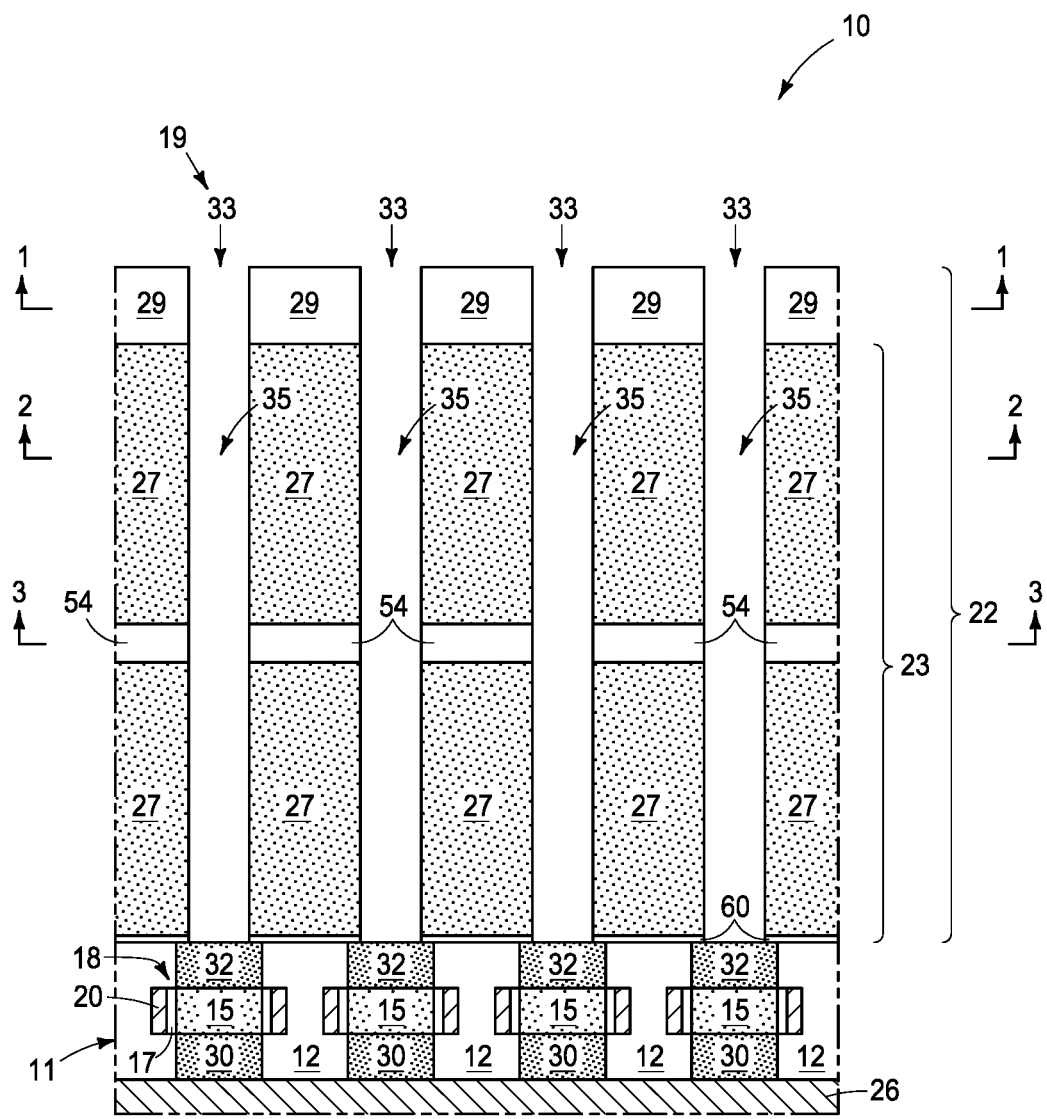

Embodiments of the invention include methods used in forming an array of capacitors and arrays of capacitors independent of method of manufacture. Example method embodiments are initially described with reference to FIGS. 1-33.

Referring to FIGS. 1-6, such show a portion of a substrate construction 10 comprising an array area 19 in which an array of capacitors will be fabricated (e.g., array area 19 being the area in which all capacitors of the array/sub-array will be formed). Construction 10 comprises a base substrate 11 comprising any one or more of conductive/conductor/conducting, semiconductive/semiconductor/semiconducting, and insulative/insulator/insulating (i.e., electrically herein) materials. Various materials have been formed elevationally over and within base substrate 11. Materials may be aside, elevationally inward, or elevationally outward of the FIGS. 1-6 depicted materials. For example, other partially or wholly fabricated components of integrated circuitry may be provided somewhere above, about, or within base substrate 11. Control and/or other peripheral circuitry for operating components within an array of capacitors and/or memory cells may also be fabricated and may or may not be wholly or partially within an array or sub-array. Further, multiple sub-arrays may also be fabricated and operated independently, in tandem, or otherwise relative one another. As used in this document, a "sub-array" may also be considered as an array.

Rows 14 and columns 16 of transistors 18, which in one embodiment are vertical transistors, have been formed relative to or within substrate 11. A gateline 20 (FIGS. 5 and 6) interconnects multiple of transistors 18 along individual rows 14 in a row direction 24. In the example embodiment, gatelines 20 are individually shown formed as a pair of lines running on opposite sides of a channel region 15 of individual transistors 18, with a gate insulator 17 being between channel regions 15 and conductive material of gatelines 20. Transistors 18 individually comprise a lower source/drain region 30 and an upper source/drain region 32. Regions 32, 15, and 30 may be of any one or more suitable horizontal cross-sectional shapes, with square (as shown) or rectangular (not shown) being ideal at least for channel region 15 towards maximizing lateral overlap of gateline 20 with channel region 15. A digitline 26 interconnects multiple transistors 18 along individual columns 16 in a column direction 28, Individual lower source/drain regions 30 are directly electrically coupled with individual digitlines 26. Dielectric material 12 (e.g., silicon dioxide and/or silicon nitride) is shown surrounding transistors 18 and digitlines 26. By way of example only, transistors 18 may be configured to control access to individual capacitors, for example in DRAM circuitry where a transistor 18 and a capacitor (not yet shown) comprise components of a single memory cell (e.g., a one transistor, one capacitor [1T/1C] memory cell). However, other memory and non-memory circuitry are contemplated and whether existing or yet-to-be-developed.

In one embodiment, a stack 22 has been formed vertically outward (e.g., above) of base substrate 11. Example stack 22 comprises lower material 23 having masking material 29 (e.g., polysilicon and/or carbon-containing hard-masking material) directly there-above. Example lower material 23 comprises insulative material 60 (e.g., silicon nitride and/or silicon oxynitride) that may have functioned as an etch-stop. Insulating material 54 (e.g., silicon nitride and/or silicon oxynitride) is above insulative material 60 and sacrificial material 27 (e.g., doped or undoped silicon dioxide) is directly above and directly below insulating material 54. Masking-material openings 33 have been formed in masking material 29 in array area 19 (e.g., by photolithographic patterning and etch) and correspond to locations where individual vertically-elongated first capacitor electrodes will be formed. Lower-material openings 35 have then been etched into lower material 23 through masking-material openings 33 using masking material 29 as a mask. Lower-material openings 35 may taper radially inward moving deeper into the stack (not shown). Openings 33/35 may be of any one or more suitable horizontal cross-sectional shapes, with circular being shown.

Figure 7:
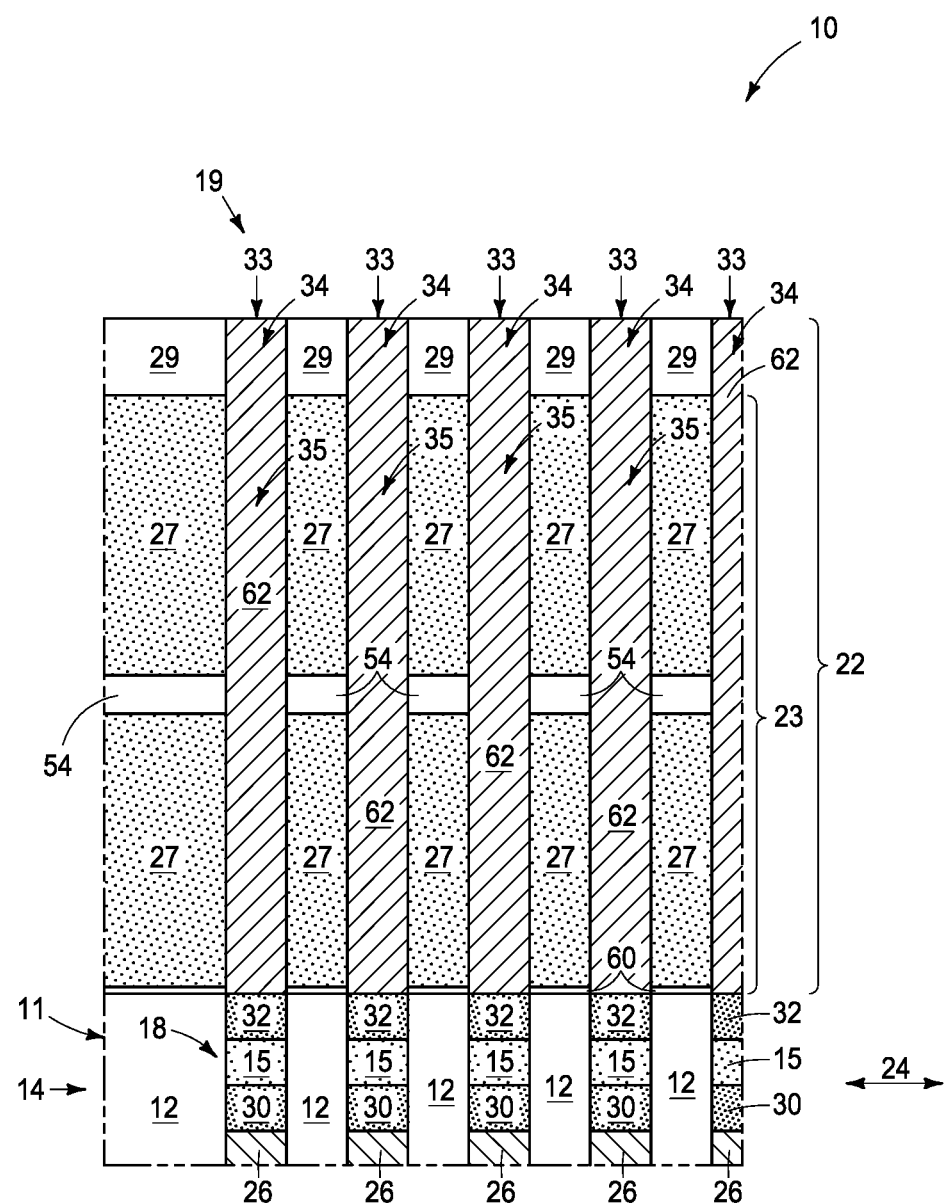
FIGS. 7-33 are diagrammatic sequential sectional, expanded, enlarged, and/or partial views of the construction of FIGS. 1-6, or portions thereof, in process in accordance with some embodiments of the invention.
Figure 8:
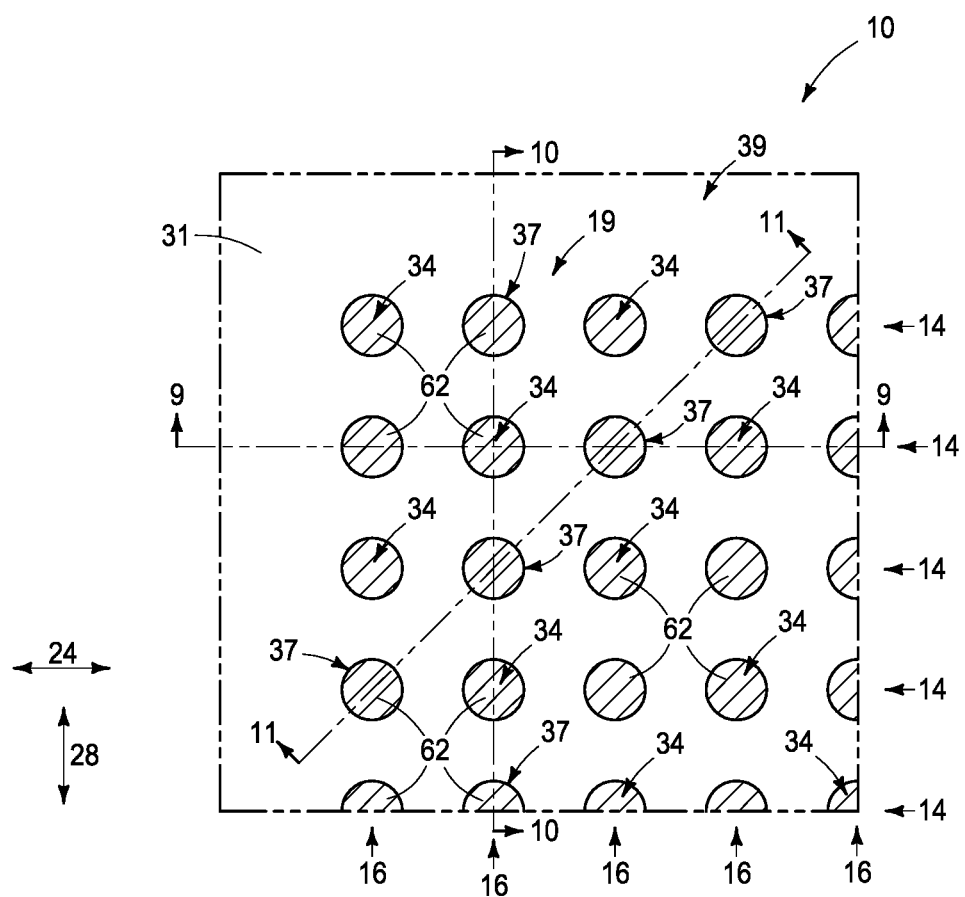
Figure 9:
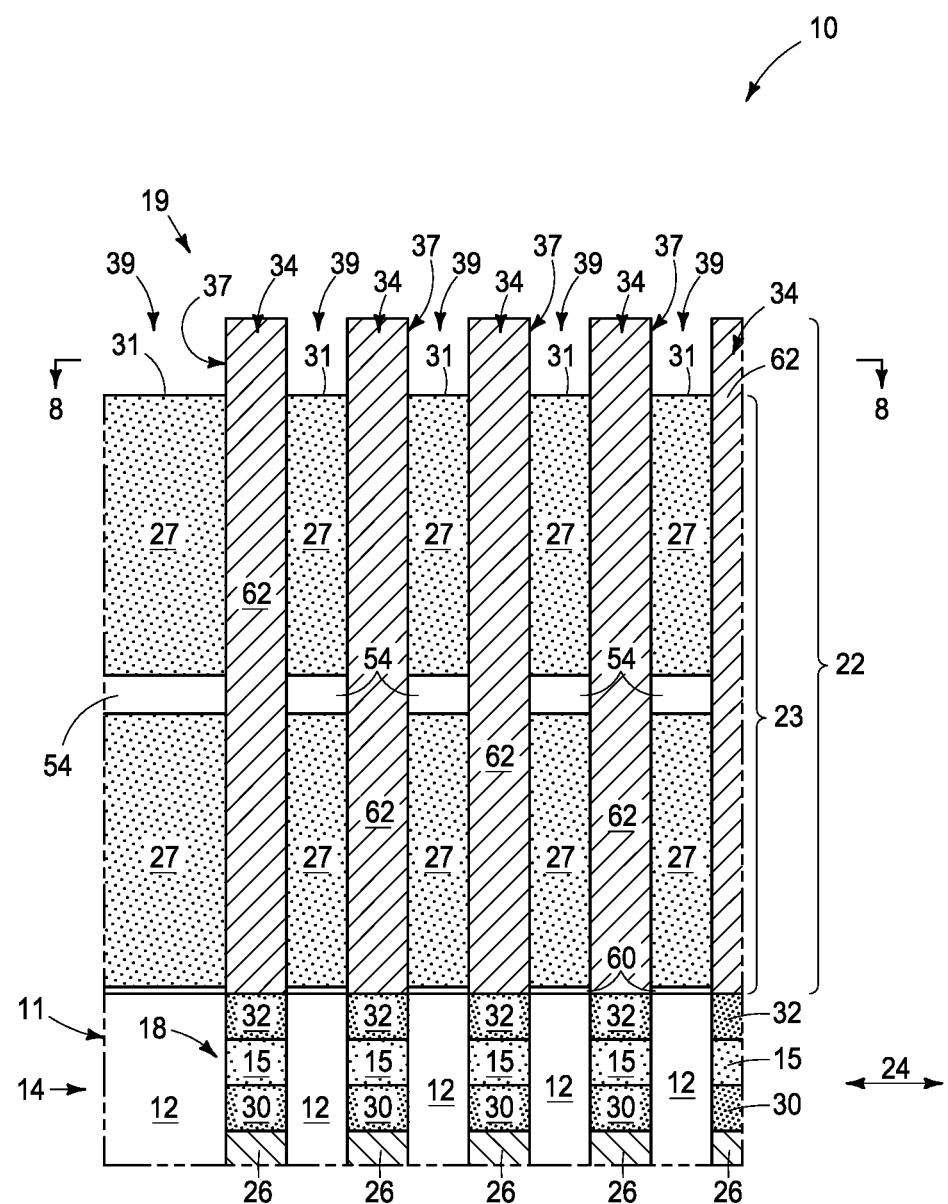
Figure 10:
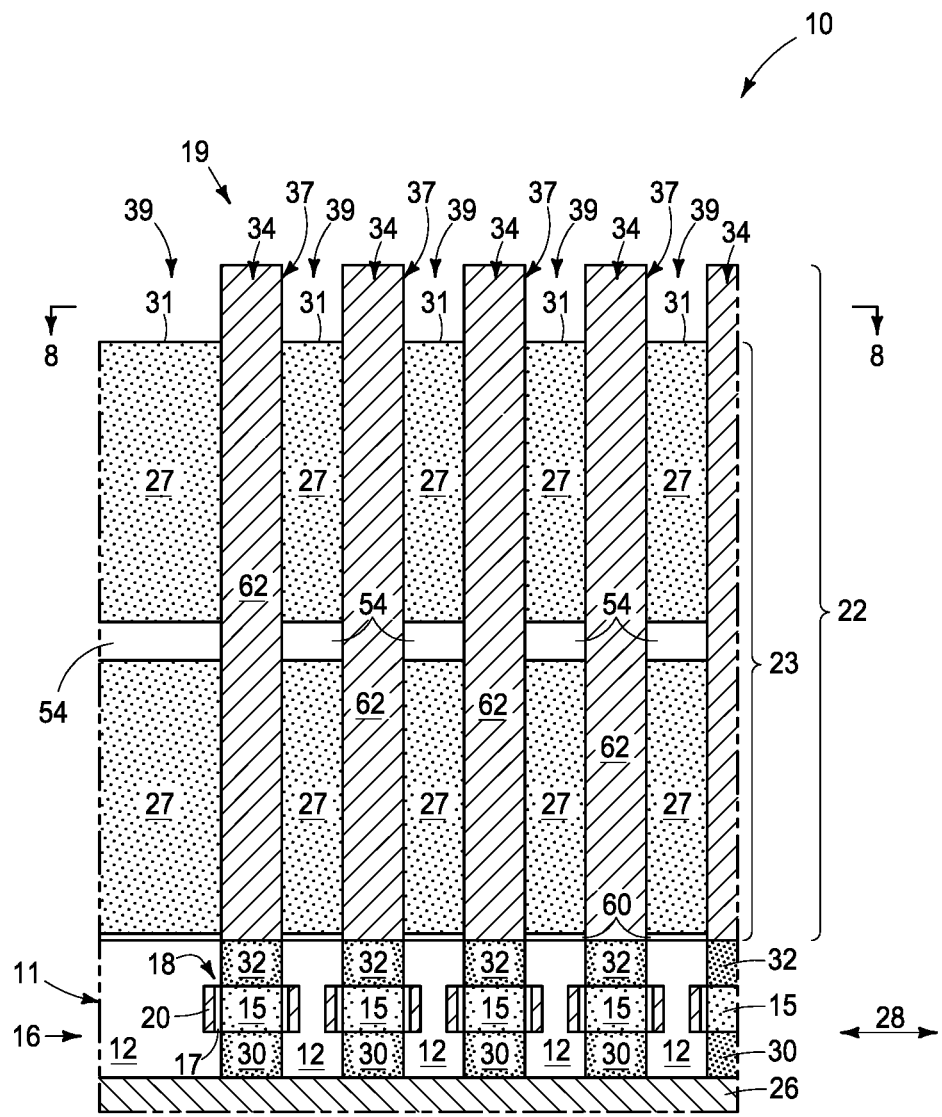
Figure 11:
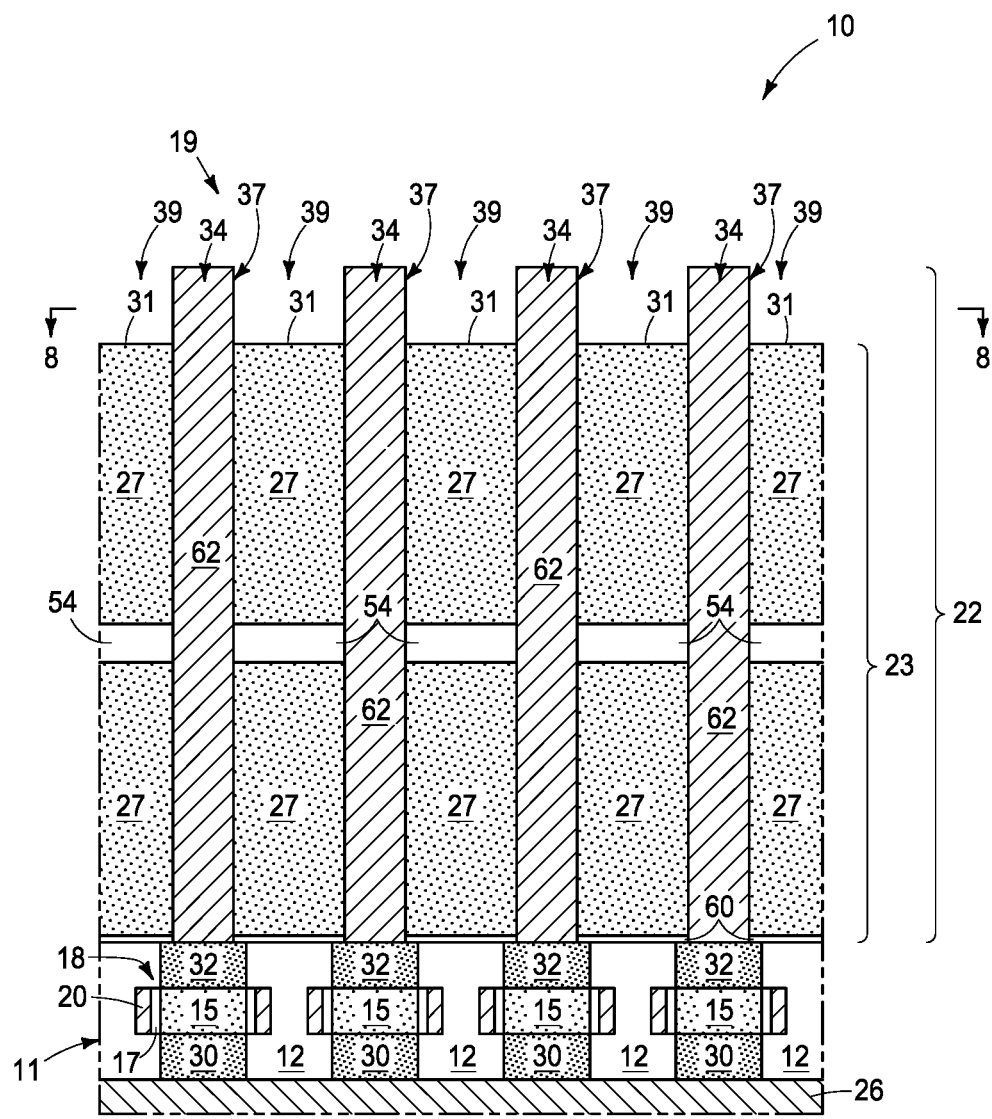

Referring to FIG. 7 (same cross-section as FIG. 4) vertically-elongated first capacitor electrodes 34 have been formed individually in individual vertically-aligned masking-material openings 33 and lower-material openings 35. Example first capacitor electrodes 34 individually comprise a solid pillar comprising conductive material 62, for example conductively-doped semiconductive material and/or metal material, with an outer TiN liner and a central W or conductively-doped polysilicon core being a couple of specific examples. First capacitor electrodes 34 may have a hollow core (not shown), may have a core comprising sacrificial material (not shown), or have a nonconductive core (not shown) that remains in a finished construction of the circuitry being fabricated. First capacitor electrodes 34 may be of an upwardly-open container shape (not shown).

Referring to FIGS. 8-11, masking material 29 (not shown) has been removed from atop lower material 23 (e.g., by etching selectively relative to sacrificial material) to cause vertically-elongated first capacitor electrodes 34 to project vertically into void space 39 directly above an outer surface 31 (e.g., a top 31) of lower material 23, thereby defining or forming vertically-projecting portions 37 of first capacitor electrodes 34. In one embodiment and as shown, the above is but one example method of forming an array of vertically-elongated first capacitor electrodes 34 through sacrificial material 27, with such electrodes projecting vertically relative to sacrificial material 27. Regardless, such is also more broadly considered but one example of forming an array of vertically-elongated first capacitor electrodes 34 that project vertically relative to some outer surface (e.g., 31). Any other existing or future-developed methods may be used.

Figure 12:
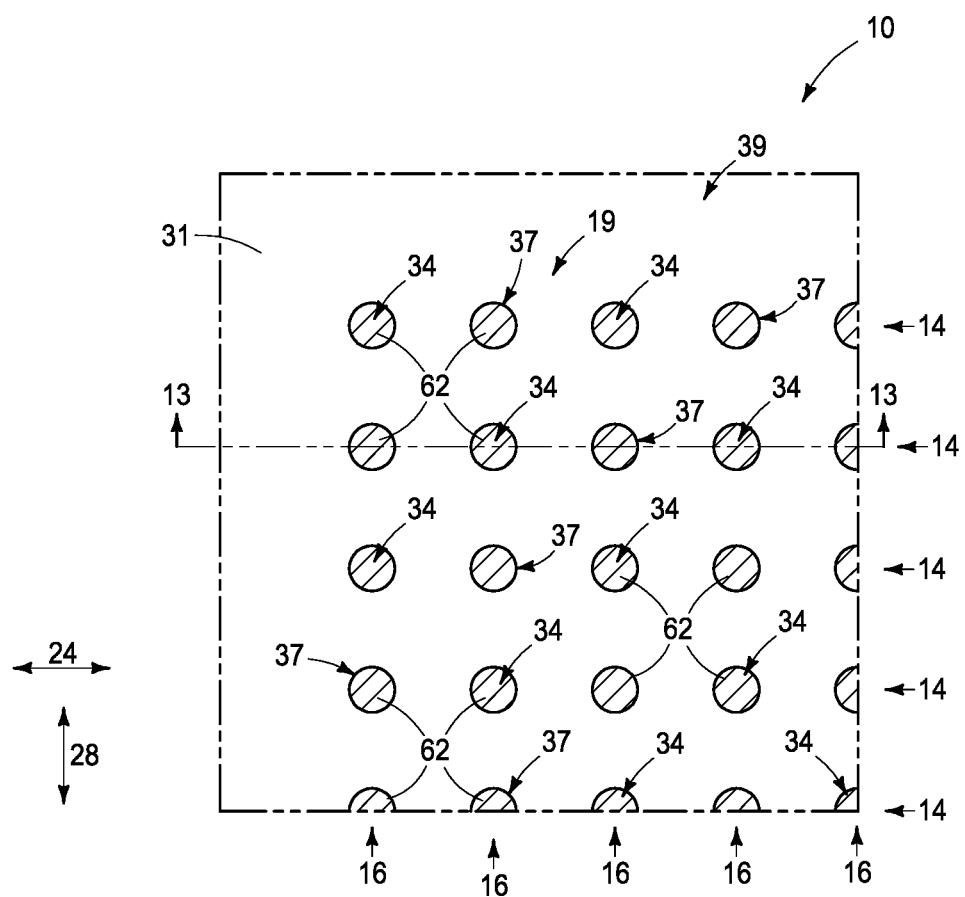
Figure 13:
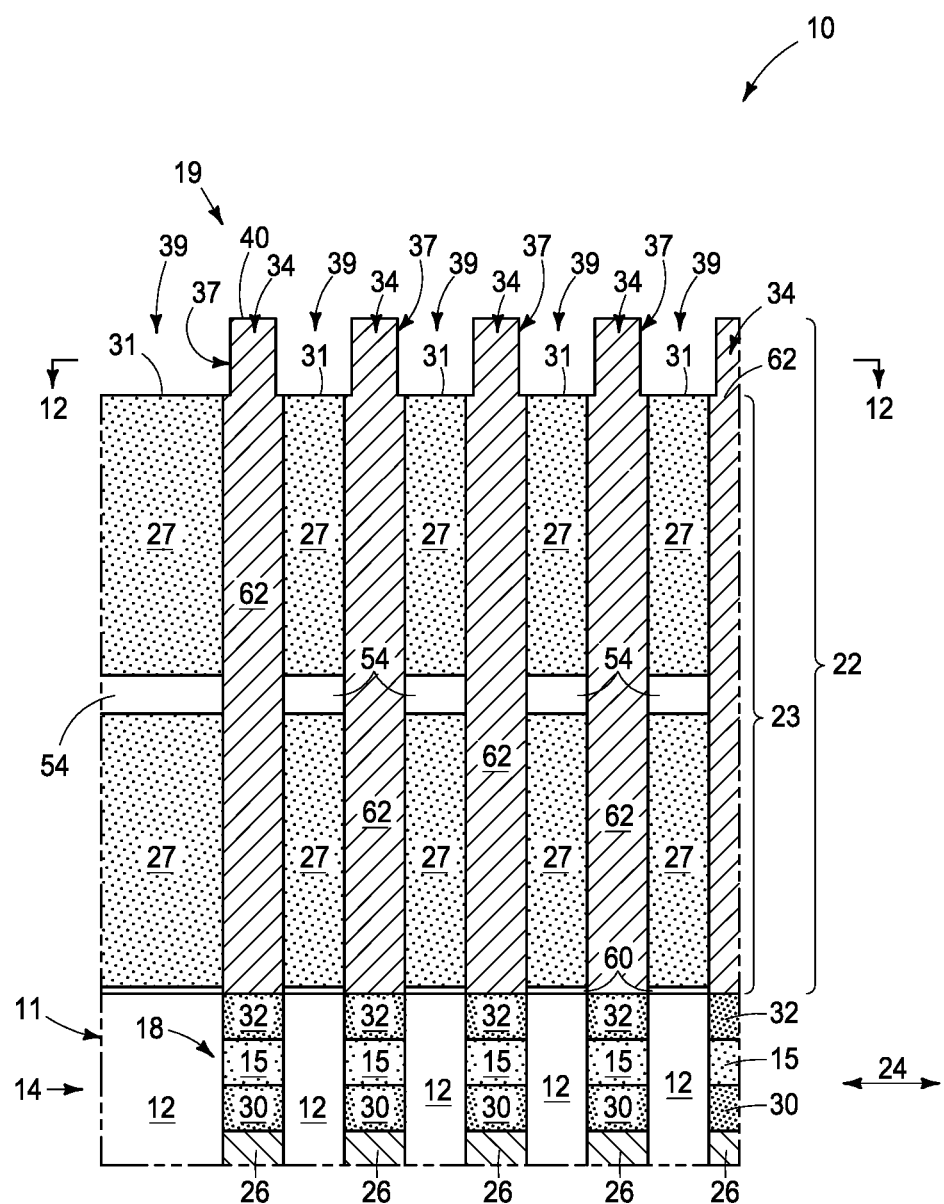
Figure 14:
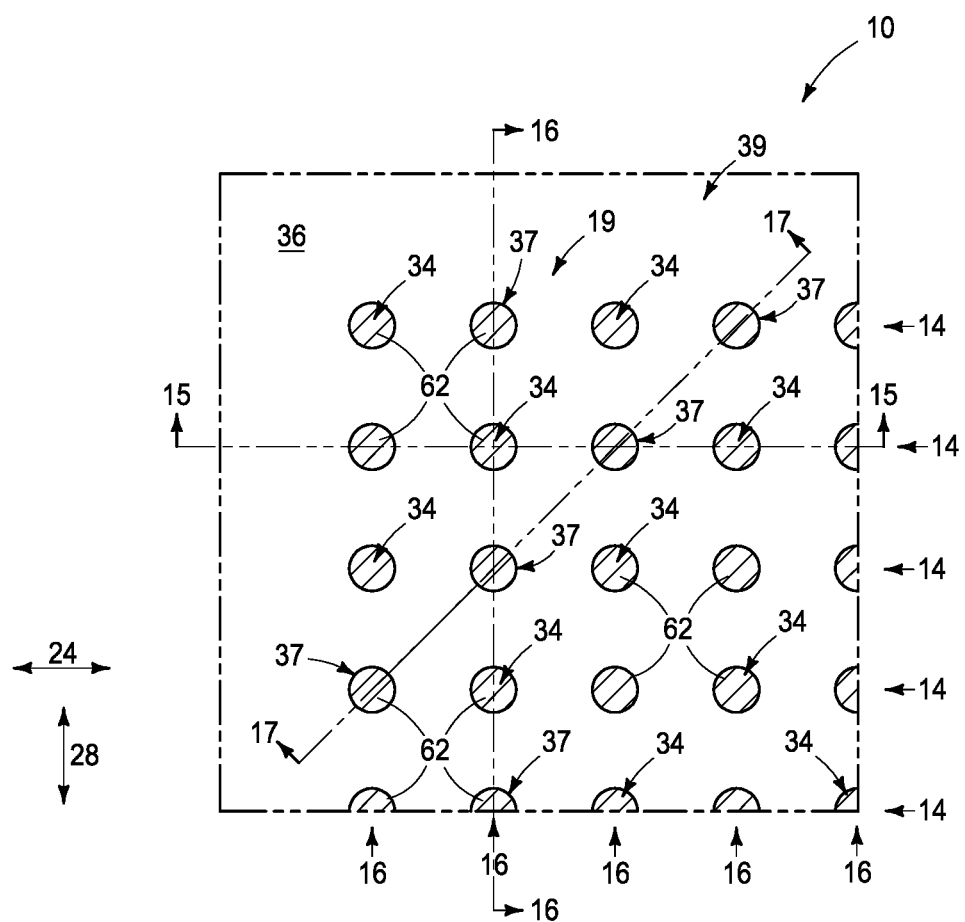
Figure 15:
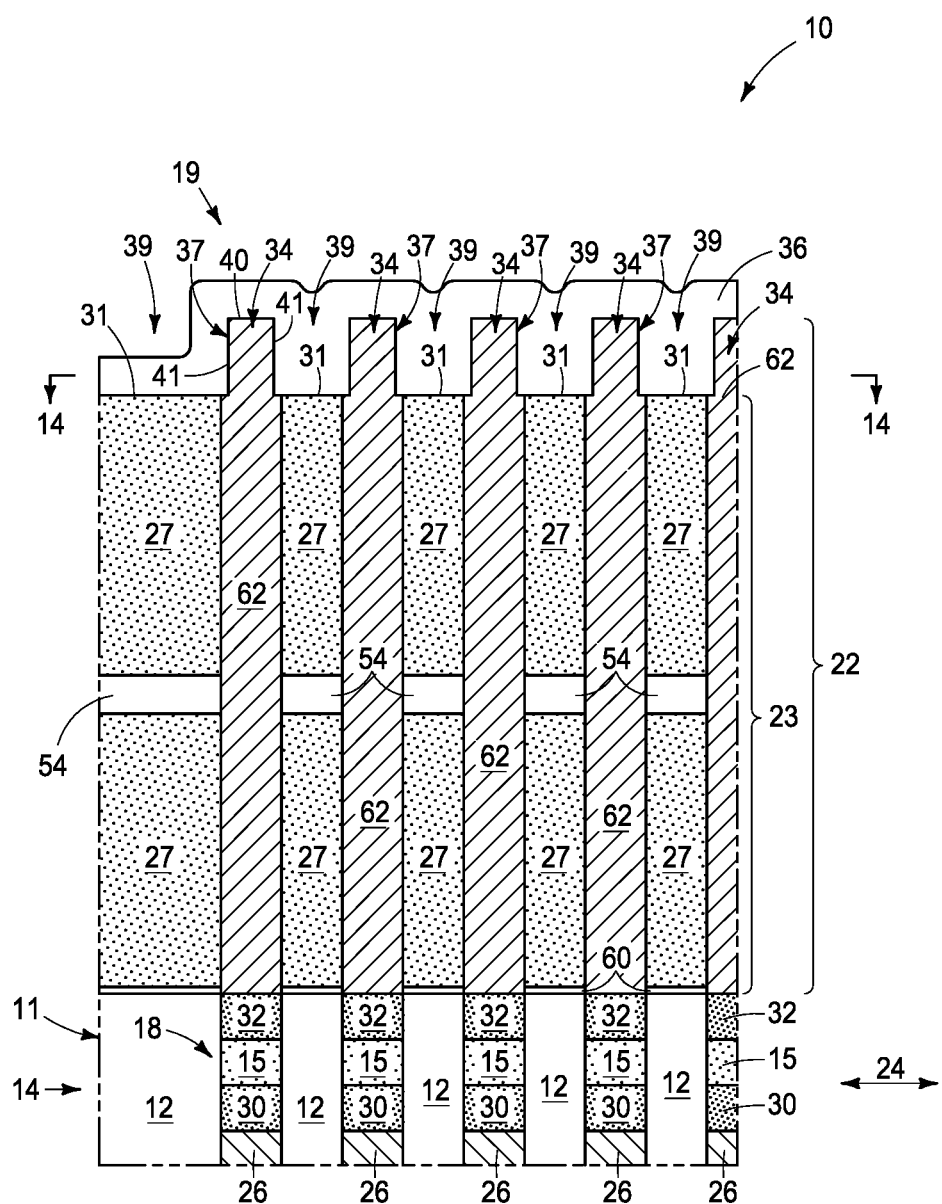
Figure 16:
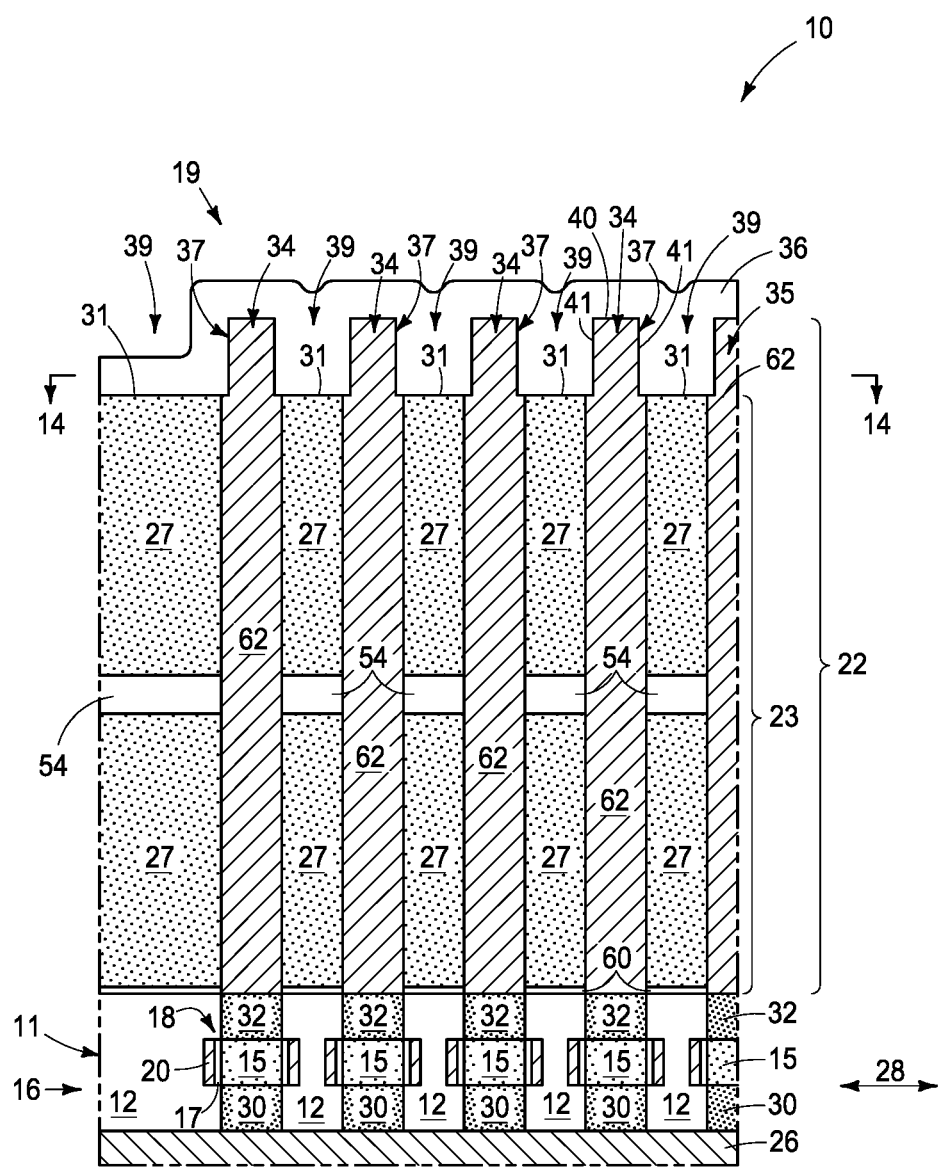
Figure 17:
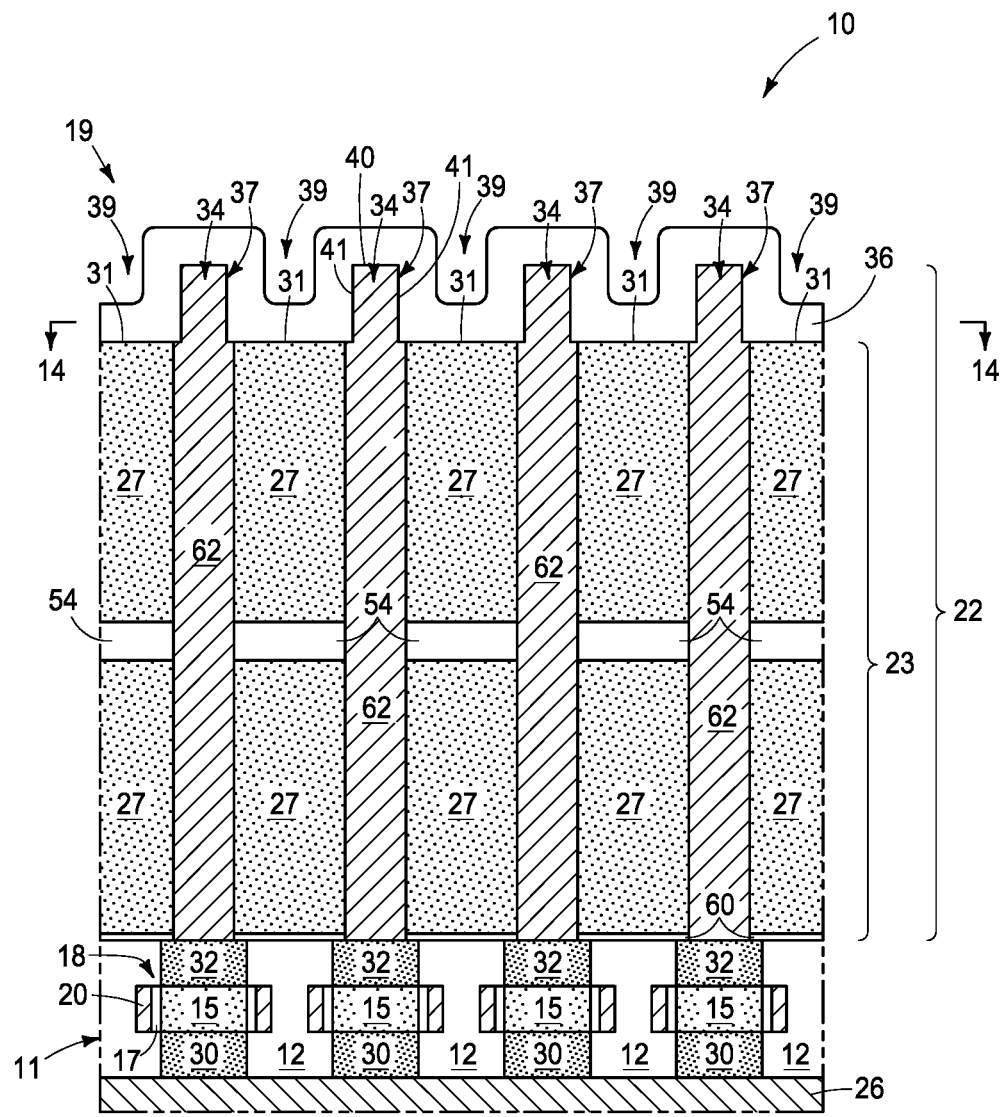
Figure 18:
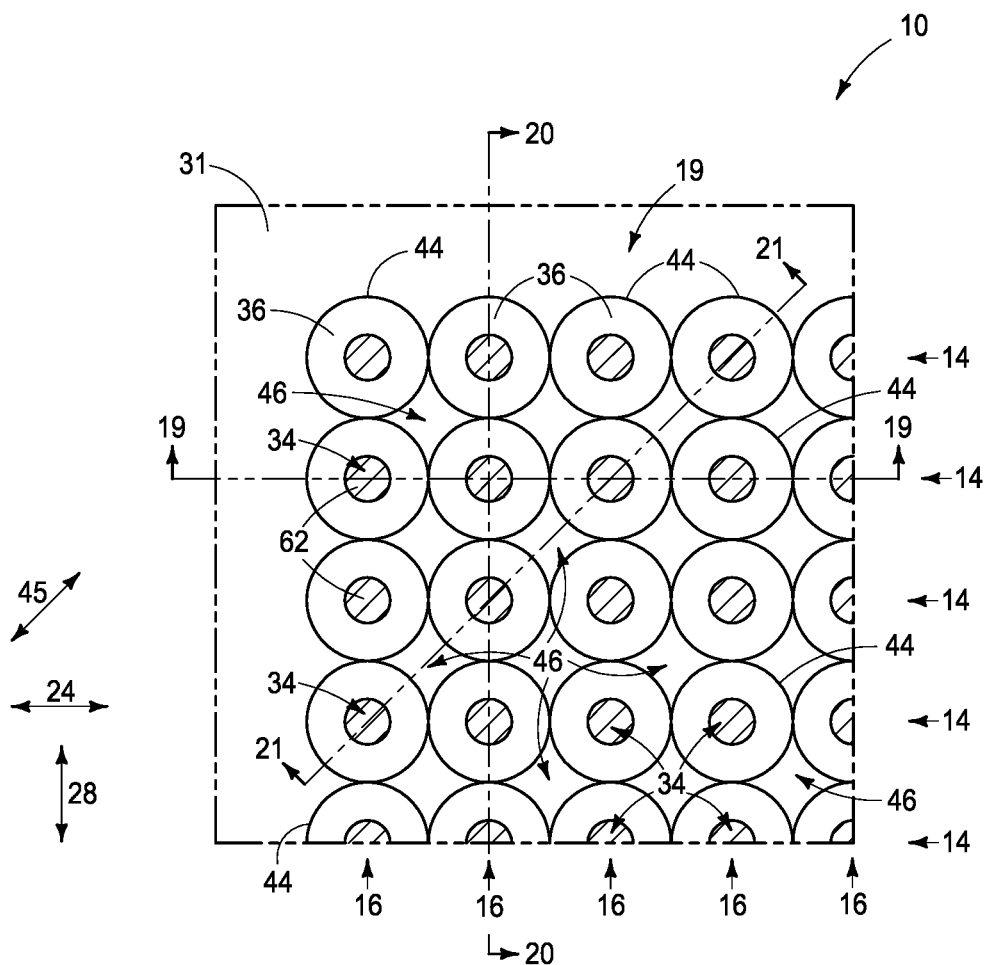
Figure 19:
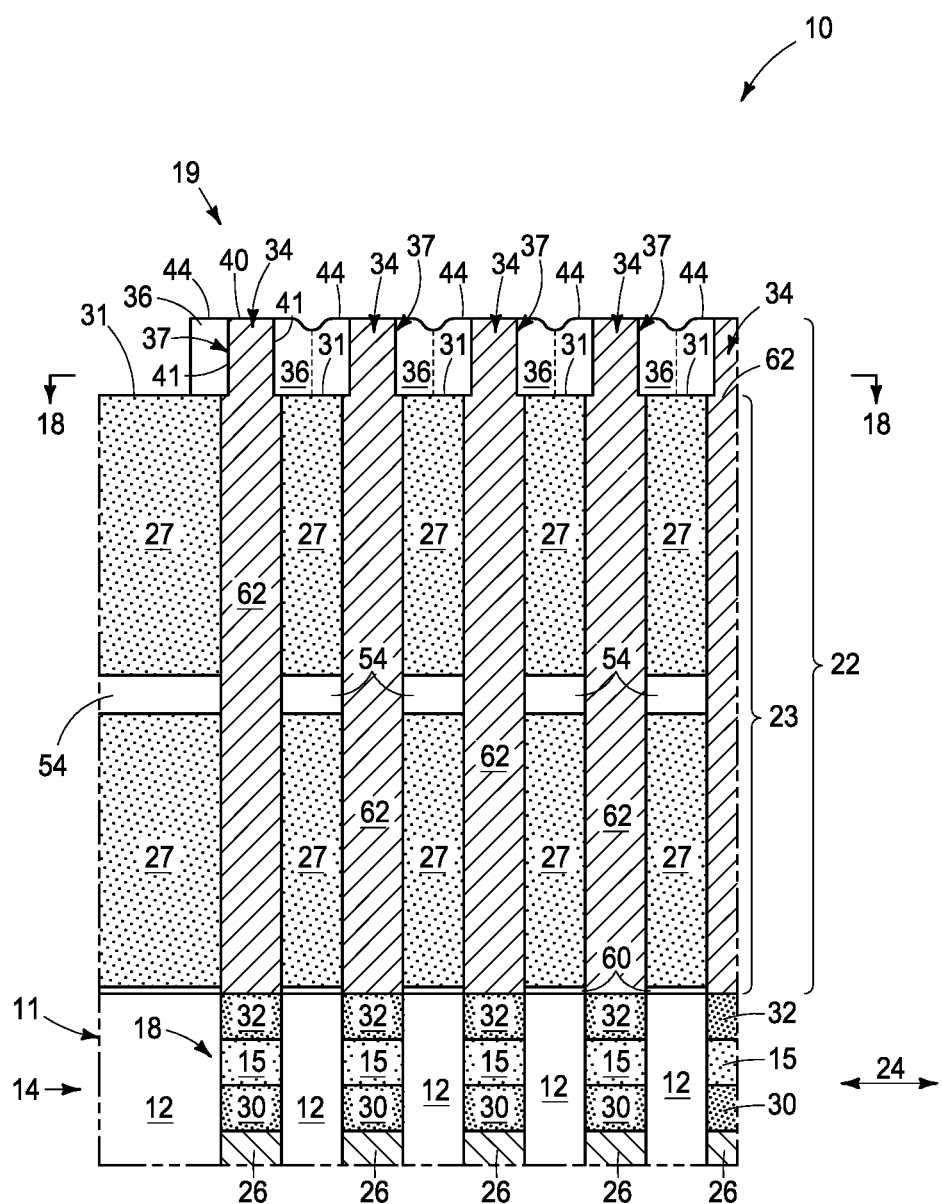
Figure 20:
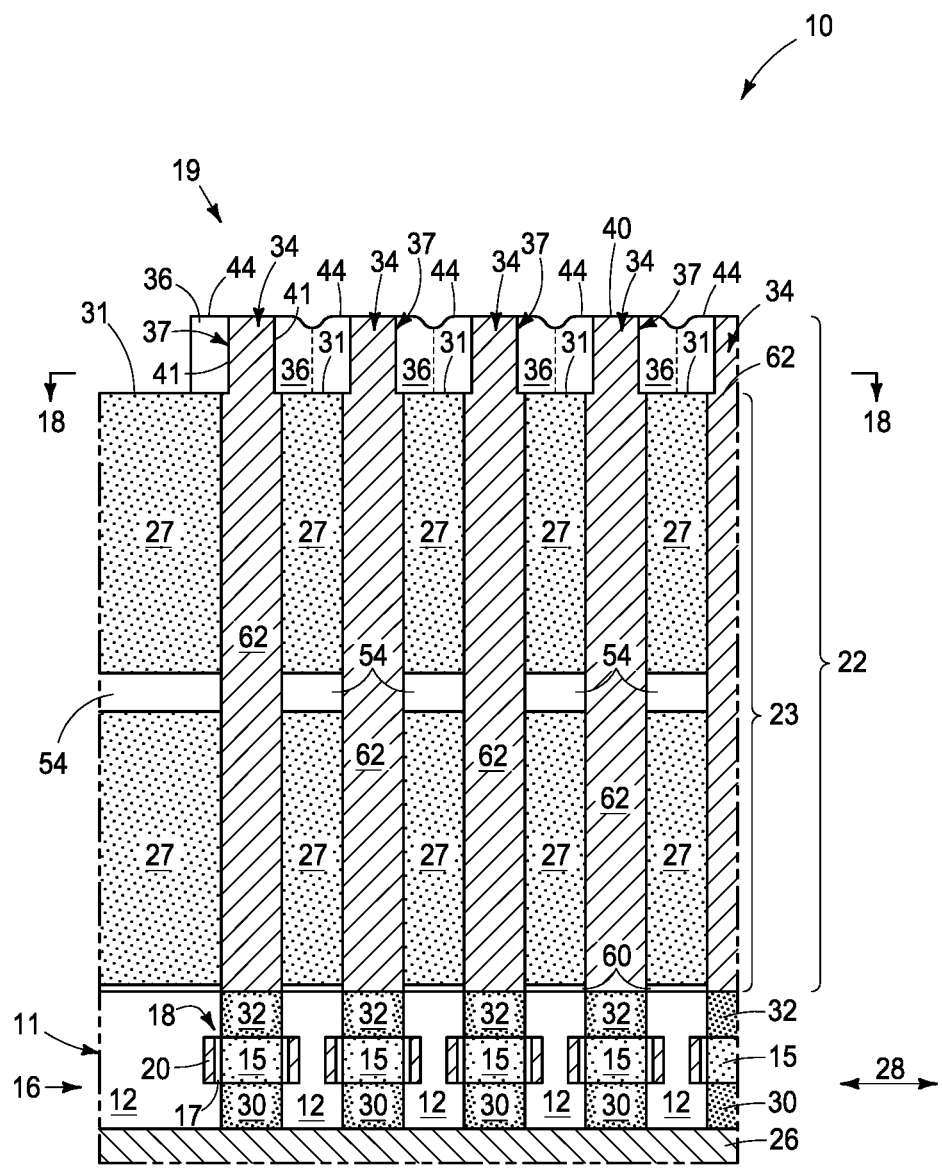
Figure 21:
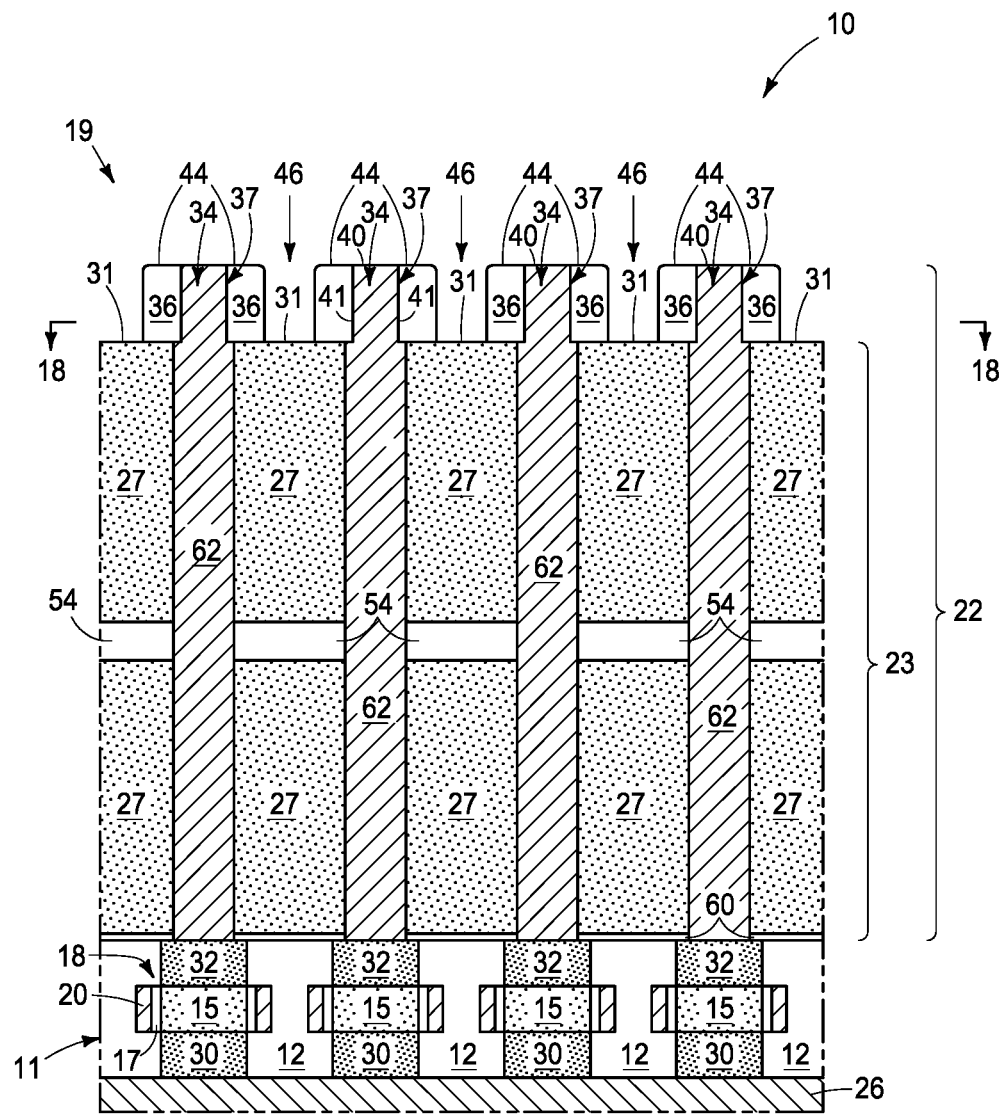

Referring to FIGS. 12 and 13 (same cross-sections as FIGS. 8 and 9, respectively), and in one embodiment, diameter of individual vertical-projecting portions 37 have been reduced, for example by isotropic etching of conductive material 62 thereof (e.g., using aqueous ammonium hydroxide and hydrogen peroxide where conductive material 62 is TiN). Such reduction of diameter may be, by way of example, anywhere from 0% to 50% of the original maximum diameter of individual vertically-projecting portions 37, with 10% to 20% being a likely ideal narrower-range example.

Referring to FIGS. 14-17, insulative material 36 (e.g., silicon nitride and/or silicon oxynitride) has been formed against tops 40 and sidewalls 41 of vertically-projecting portions 37 of first capacitor electrodes 34 and against top 31 of sacrificial material 27 that is laterally-among first capacitor electrodes 34. Insulative material 36 is horizontally-continuous (e.g., in the horizontal cross-section that is FIG. 14) within and less-than-fills void space 39 that is laterally-among vertically-projecting portions 37 of first capacitor electrodes 34 (e.g., insulative material 36 not completely filling void space 39 along section line 17-17 that is FIG. 17).

Referring to FIGS. 18-21, insulative material 36 has been etched to remove it from being horizontally-continuous within void space 39 to form an insulative ring 44 circumferentially about individual vertically-projecting portions 37 of first capacitor electrodes 34. Insulative rings 44 about immediately-adjacent first capacitor electrodes 34 in a first straight-line direction (e.g., row direction 24 or column direction 28) are laterally directly against one another. Insulative rings 44 about immediately-adjacent first capacitor electrodes 34 in a second straight-line direction (e.g., 45) that is angled relative to the first straight-line direction are laterally-spaced from one another by an opening/lateral space 46 through insulative material 36 along the second straight-line direction. Insulative rings 44 are shown as being tangent along row direction 24 and along column direction 28, but such may laterally overlap (not shown) in one or both of those horizontal cross-sections. In one embodiment and as shown, the etching of insulative material 36 removes all insulative material 36 from the tops of vertically-projecting portions 37.

Figure 22:
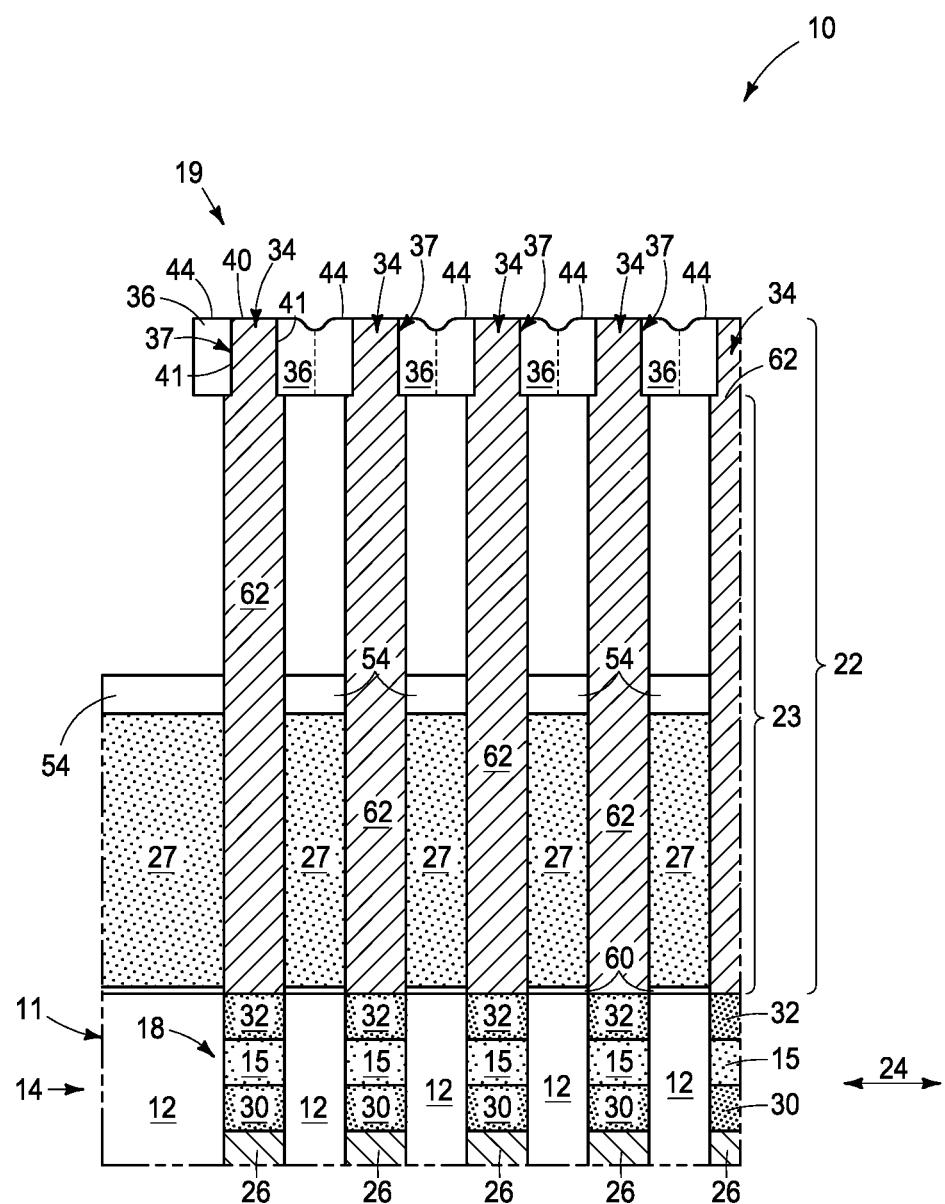
Figure 23:
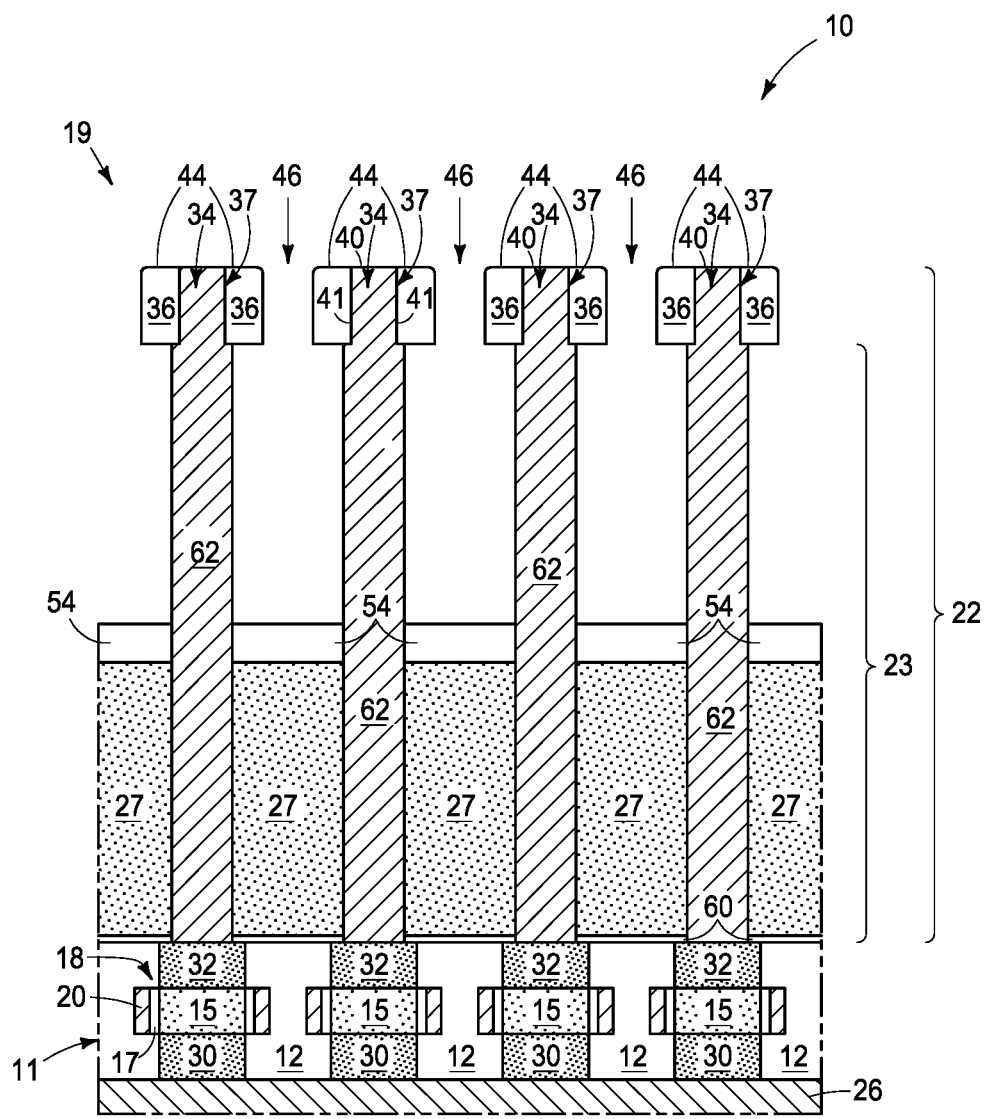
Figure 24:
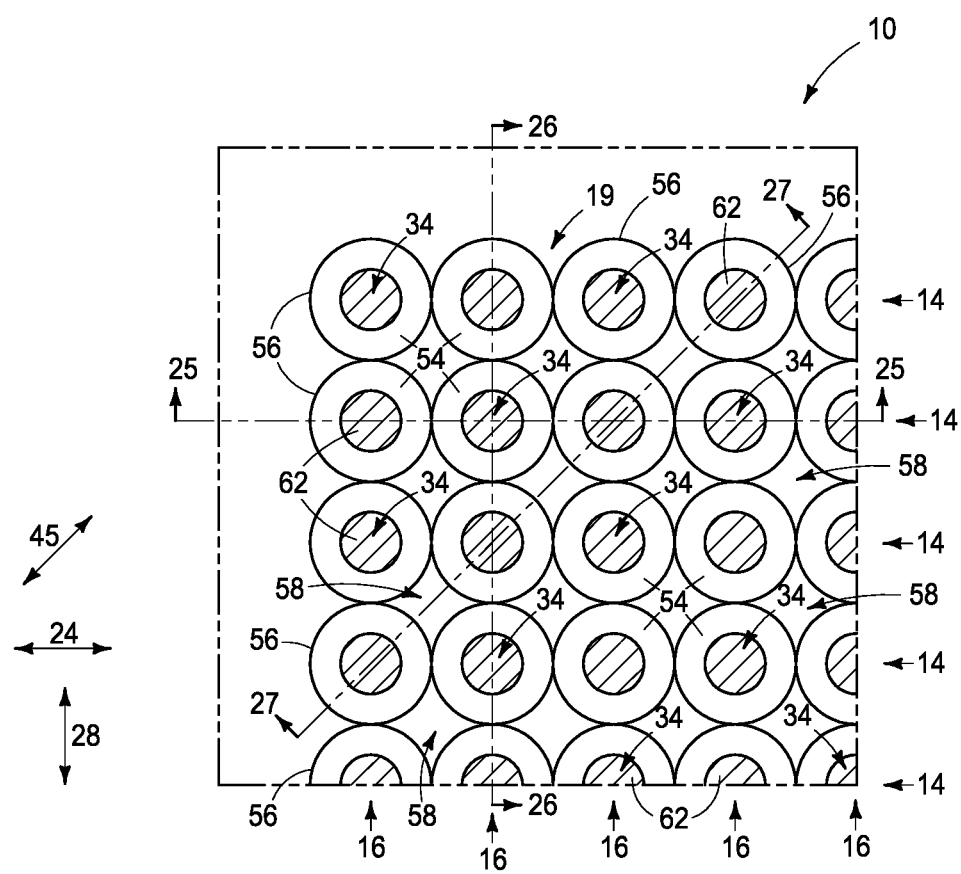
Figure 25:
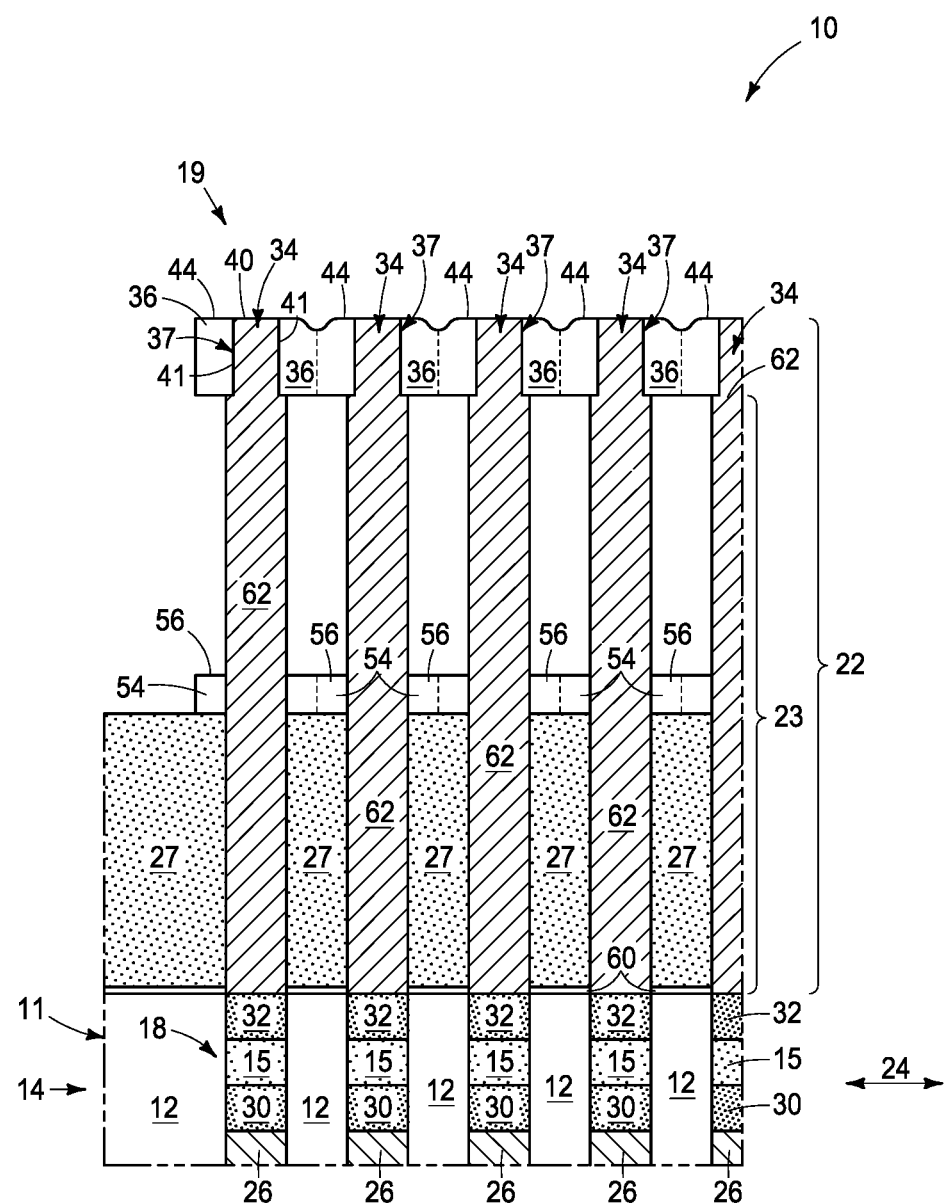
Figure 26:
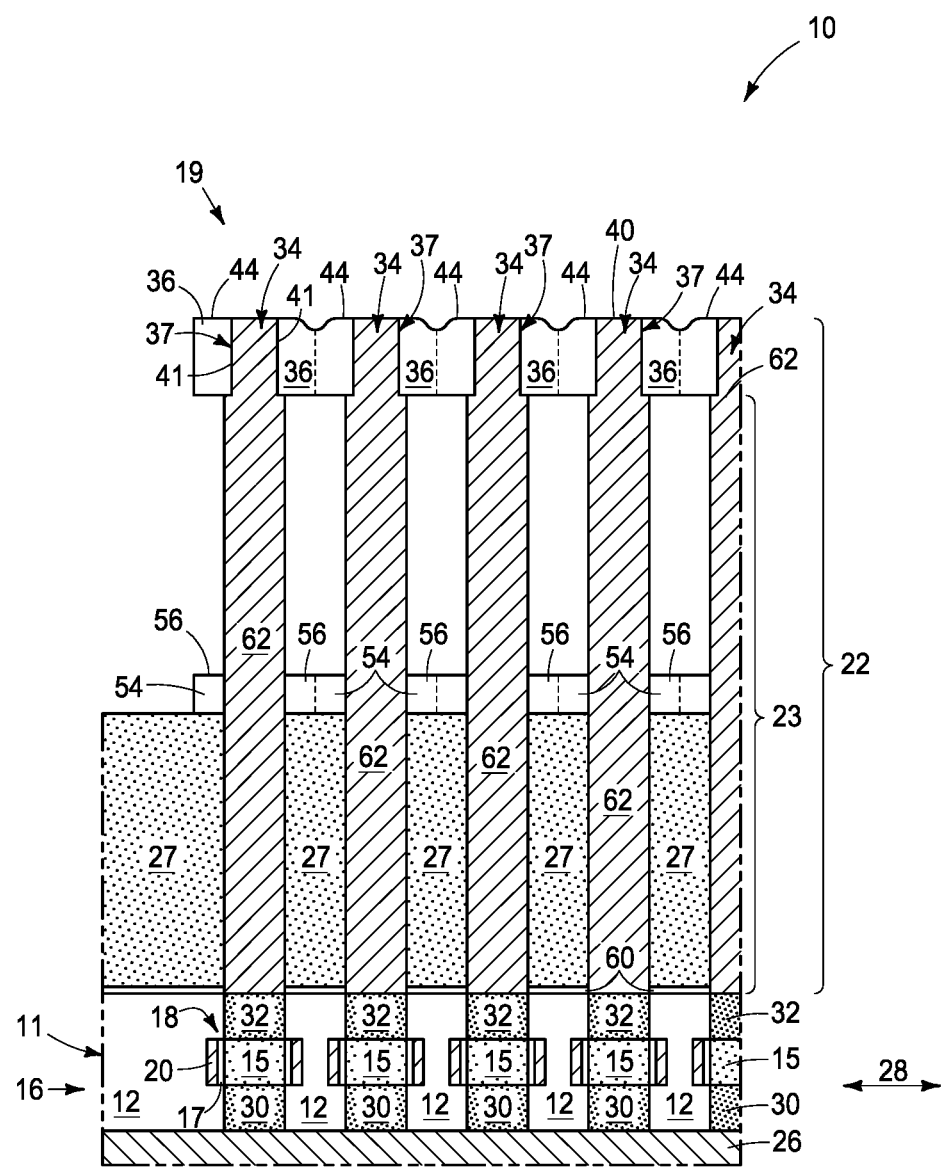
Figure 27:
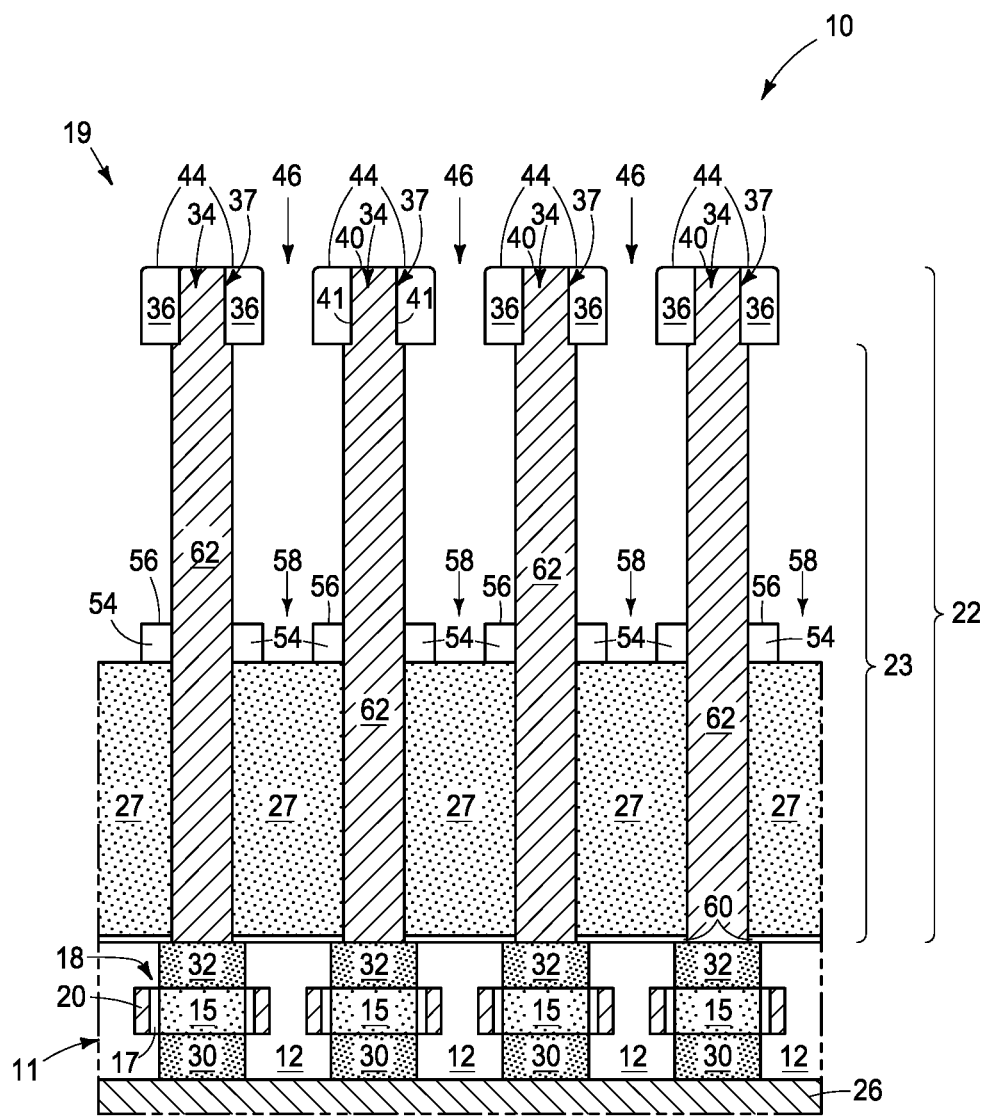

Referring to FIGS. 22 and 23 (same cross-sections as FIGS. 19 and 21, respectively), sacrificial material 27 has been etched through openings 46, for example selectively relative to insulative rings 44 and selectively relative to insulating material 54 when present. Such etching, by way of example only, is shown as having been conducted isotopically (e.g., using aqueous ammonium fluoride and HF where sacrificial material 27 is boron and/or phosphorus-doped $SiO_2$). Such example isotropic etching of exposed sacrificial material 27 will also occur laterally from sides of array area 19.

Referring to FIGS. 24-27, and in one embodiment where insulating material 54 is present, insulative rings 44 and vertically-elongated first capacitor electrodes 34 have been used as a mask while etching (anisotropically using an $SF_6$, $O_2$, $CHF_3$ plasma) insulating-material openings (lateral spaces) 58 through insulating material 54 through lateral spaces 46 that are individually laterally-between immediately-adjacent first capacitor electrodes 34 (between insulative rings 44) along second straight-line direction 45 to form insulating rings 56 circumferentially about individual first capacitor electrodes 34. Insulating rings 56 about immediately-adjacent first capacitor electrodes 34 in first straight-line direction 24 or 28 are laterally-directly against one another, Insulating rings 56 about immediately-adjacent first capacitor electrodes 34 in second-straight-line direction 45 are laterally-spaced from one another (e.g., by openings/lateral spaces 58).

Figure 28:
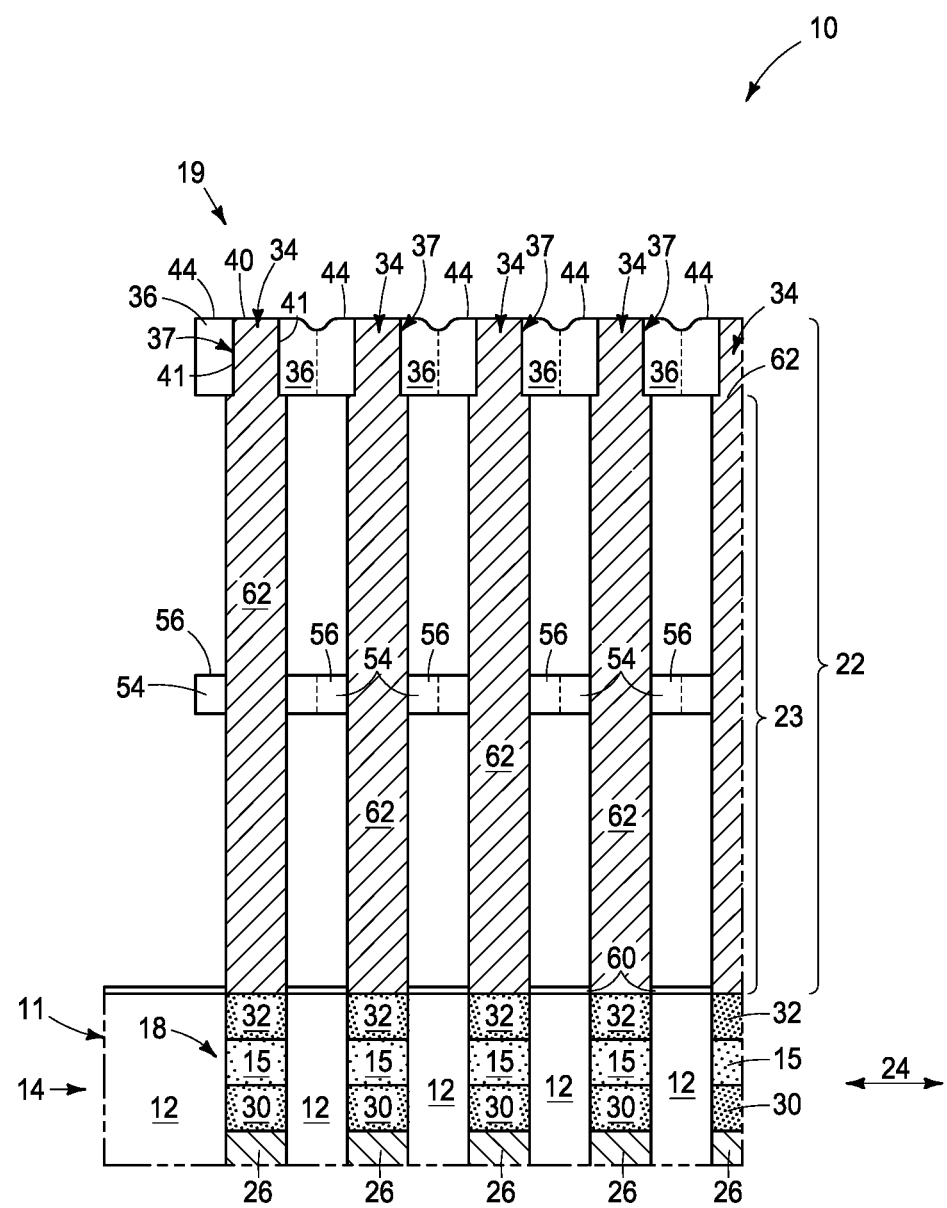
Figure 29:
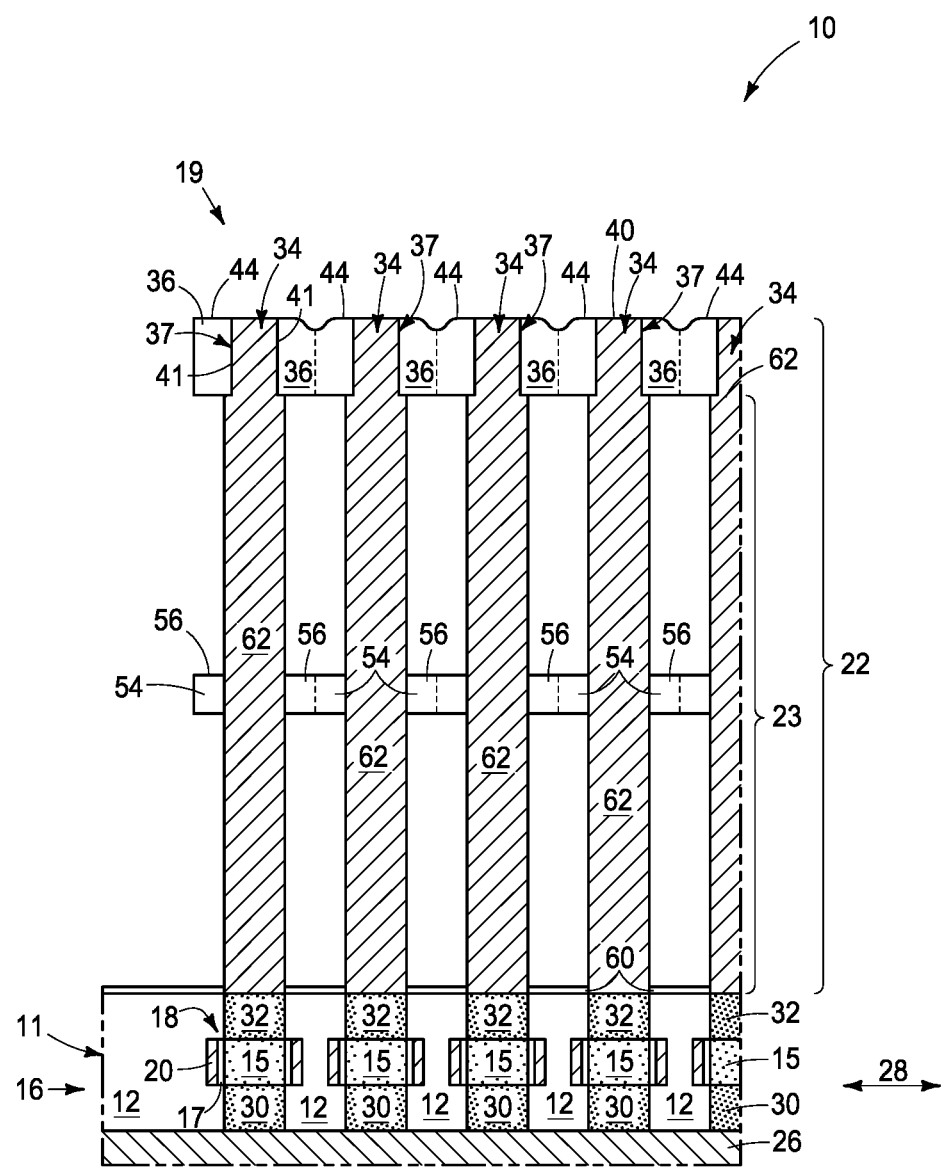
Figure 30:
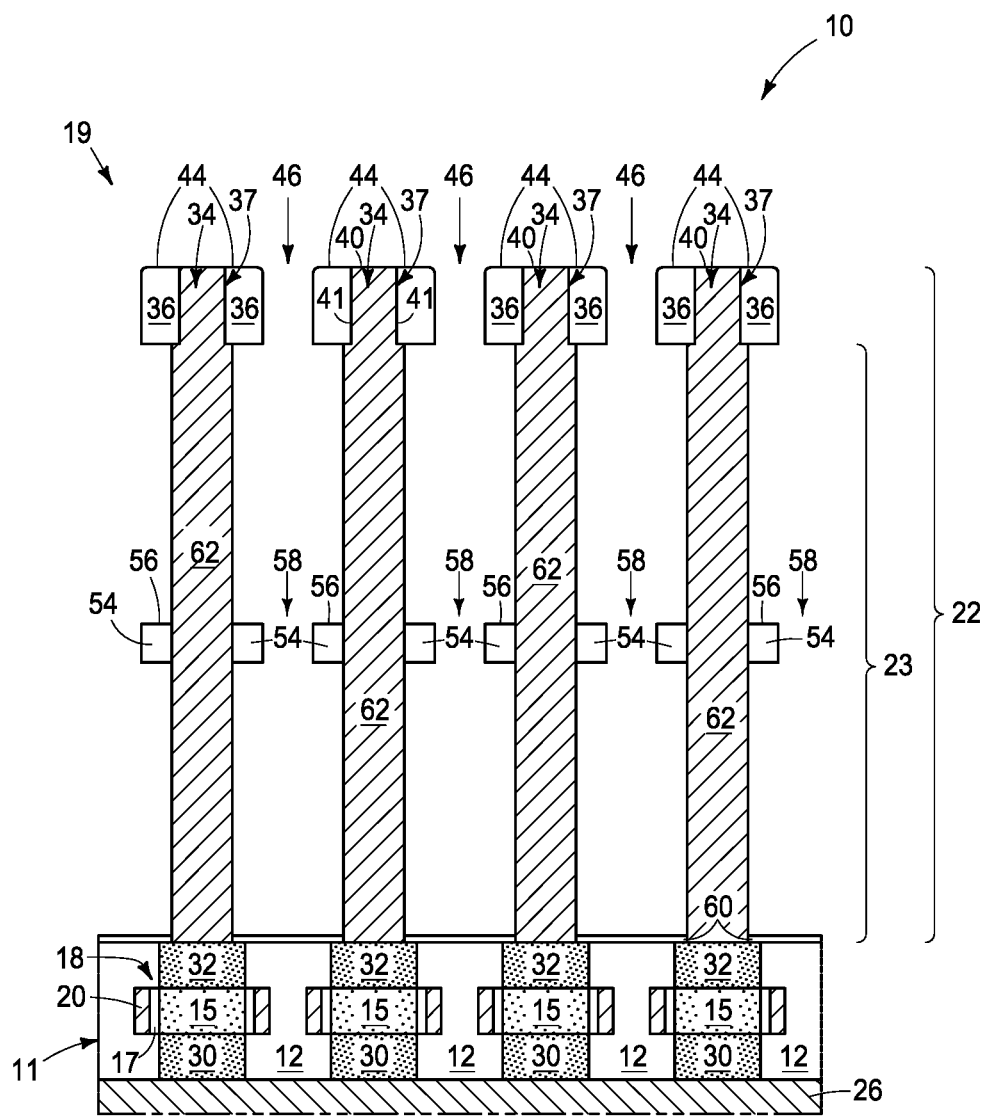

Referring to FIGS. 28-30 (same cross-sections as FIGS. 25-27, respectively), sacrificial material 27 (not shown) that was directly below insulating material 54, in some embodiments referred to as "more of the sacrificial material", has been removed from being below insulating rings 56. For example, such can be conducted as described above by isotropic etching through lateral spaces/openings 58 that are individually between immediately-adjacent first capacitor electrodes 34 (between insulative rings 44) along second straight-line direction 45. Again, such example isotropic etching of exposed sacrificial material 27 will also occur laterally from sides of array area 19.

The above example processing shows isotropic etching of sacrificial material 27 that is above insulating material 54 prior to forming openings 58 through insulating material 54. Alternately, as an example, anisotropic etching of openings (not shown) could be conducted through sacrificial material 27 above insulating material 54 using material 36 as a mask and then through insulating material 54 before isotropically etching sacrificial material 27 that is above and below insulating material 54. Also, as an example, insulating material 54 may not be present and if present may be isotropically etched away whereby insulating rings 56 are not formed (not shown). Further and regardless, more vertically-spaced insulating-material layers 54 may be used (not shown).

Figure 31:
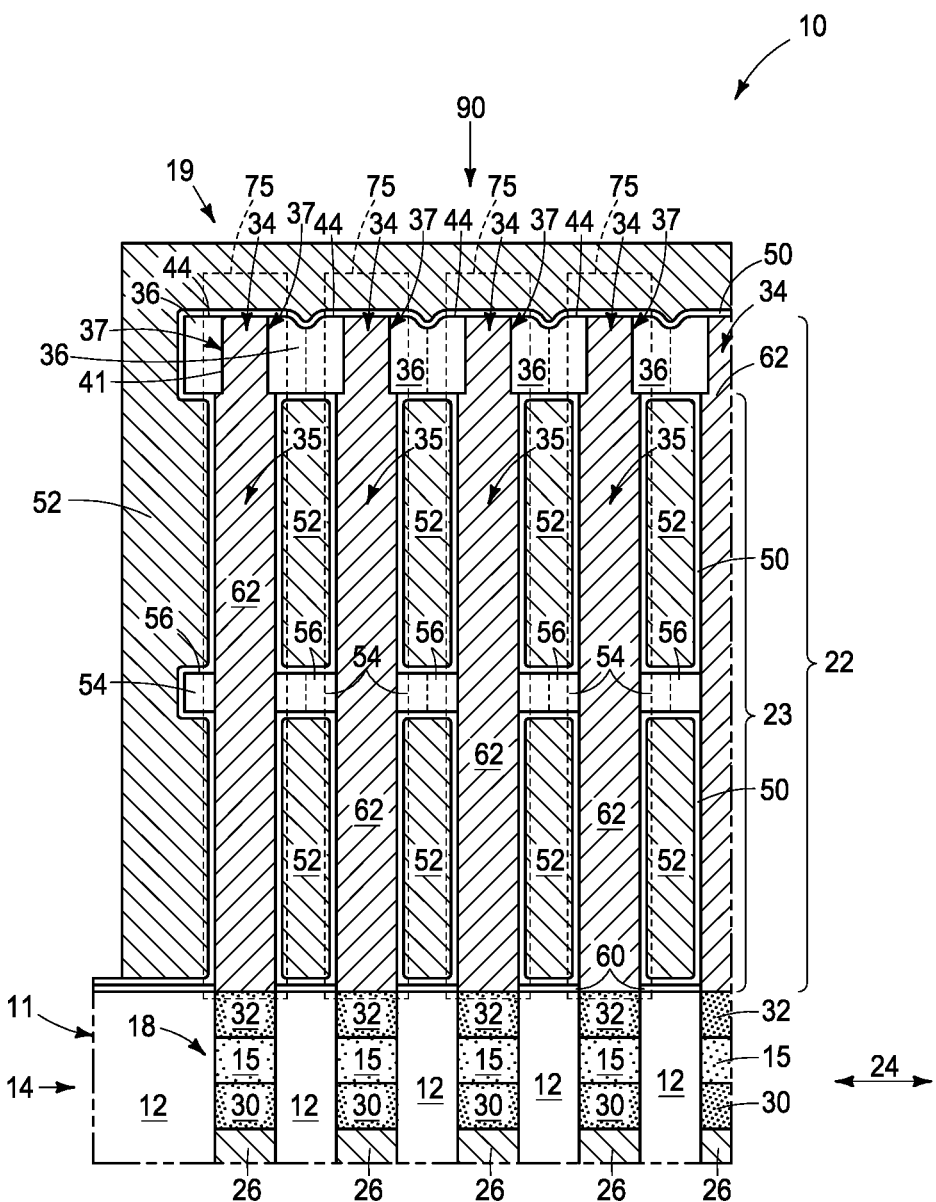
Figure 32:
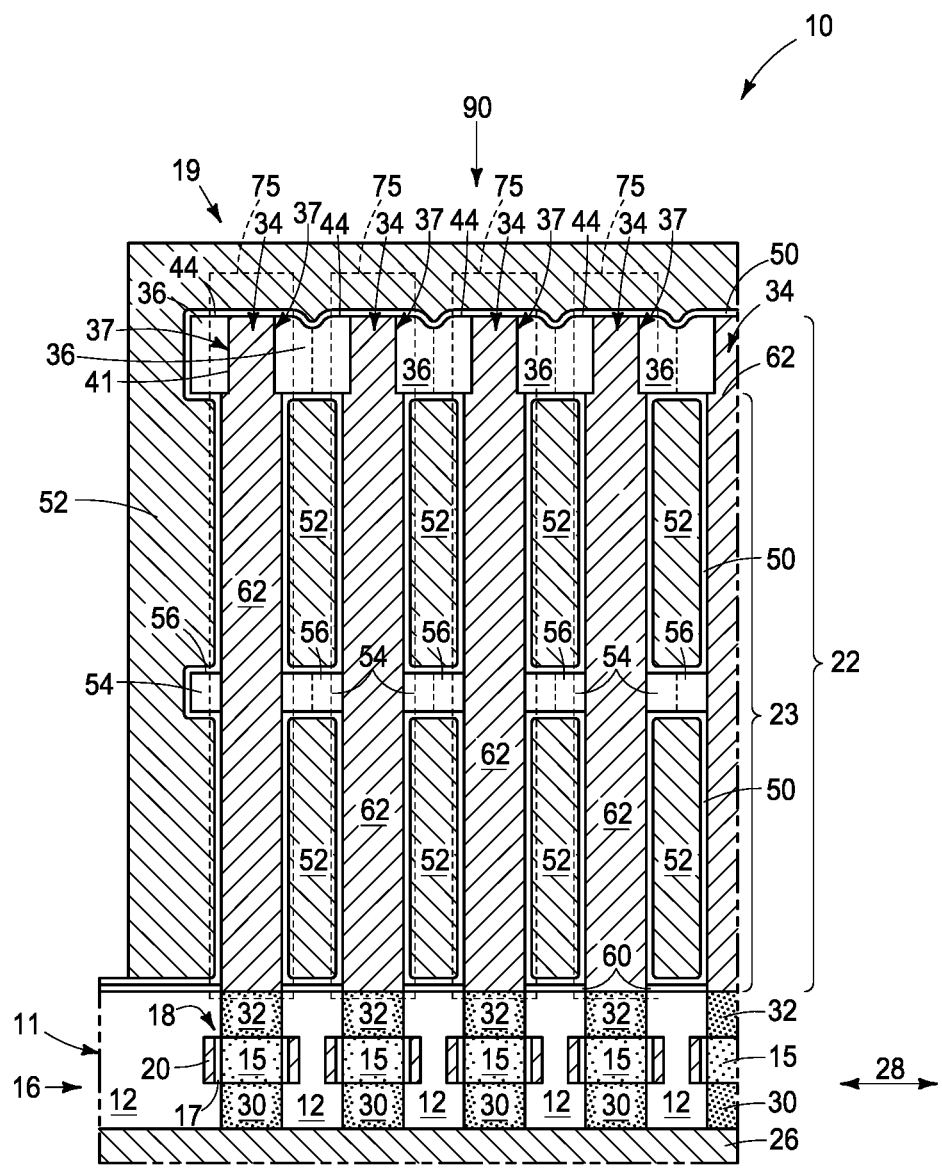
Figure 33:
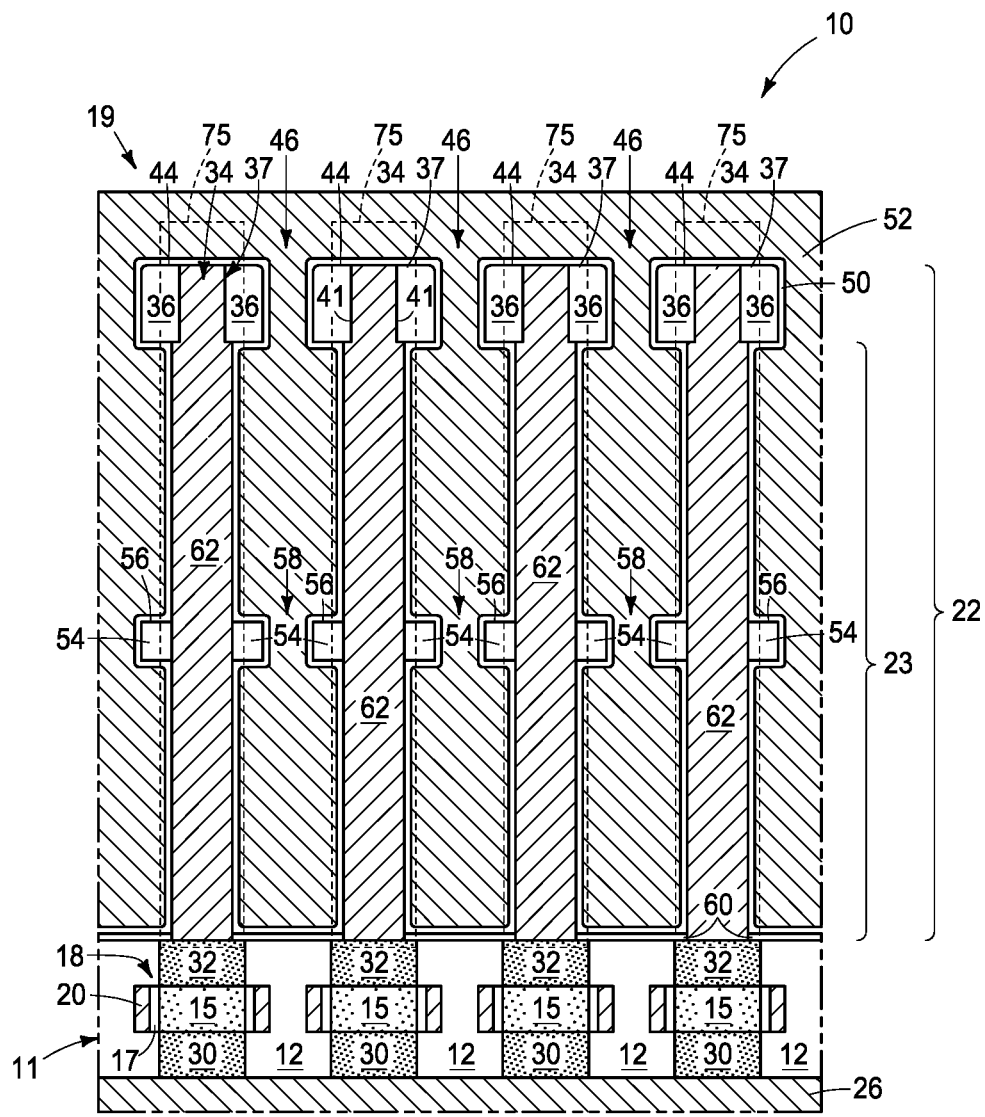

Referring to FIGS. 31-33, a capacitor insulator 50 has been formed over sidewalls of first capacitor electrodes 34 and at least one second capacitor electrode 52 has been formed over capacitor insulator 50 (e.g., with second capacitor electrode 52 being continuous within array area 19). An array 90 of individual capacitors 75 has thereby been formed. In one embodiment, capacitor insulator 50 has been formed over tops and bottoms of all insulative rings 44 and in one embodiment second capacitor electrode 52 has been formed over tops and bottoms of all insulative rings 44. Such also, in one embodiment, is shown as applying to insulating rings 56. Second capacitor electrode 52 may be of the same composition or of different composition from that of first capacitor electrodes 34. Any existing or future-developed capacitor insulator material may be used. A single capacitor 75 and a single vertical transistor 18 directly there-below may comprise a single memory cell, for example of a one transistor-one capacitor DRAM cell of DRAM integrated circuitry.

Any other attribute(s) or aspect(s) as shown and/or described herein with respect to other embodiments may be used in the embodiments shown and described with reference to the above embodiments.

The above processing shows but one example embodiment wherein the first straight-line direction (e.g., 24 or 28) is angled at 45° from second straight-line direction 45. Further and regardless, the above processing shows vertically-elongated first capacitor electrode 34 as being arrayed in a 2-dimensional (2D) lattice having a parallelogram unit cell, with second straight-line direction 45 being along a diagonal of the parallelogram unit cell. The above depiction also shows a Bravais lattice, although non-Bravais lattices may alternately be used.

Figure 34:
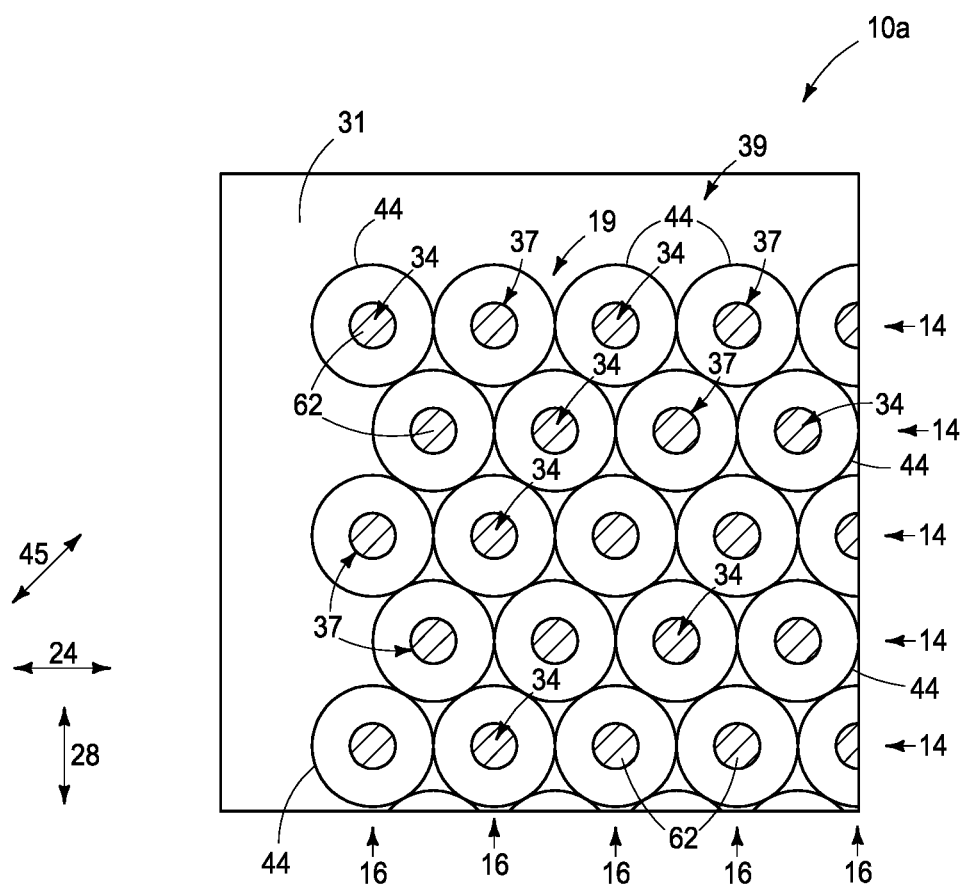
FIGS. 34-53 show alternate example methods and/or structural embodiments of the invention.
Figure 35:
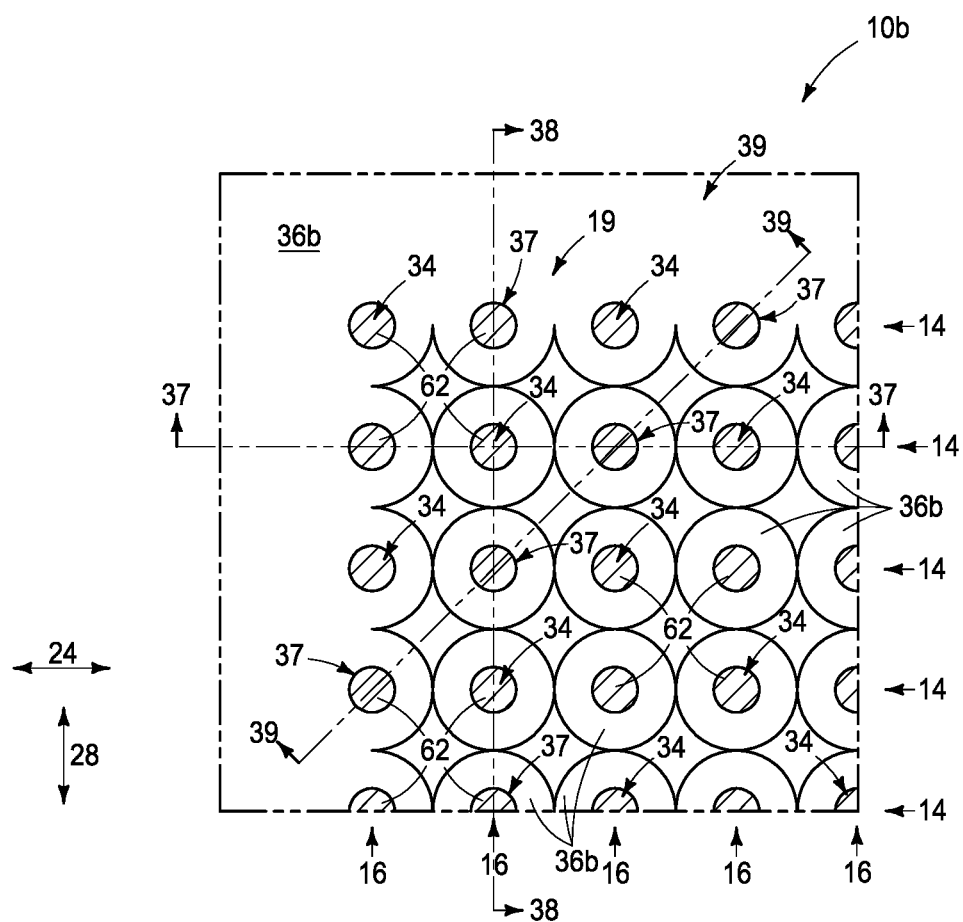
Figure 36:
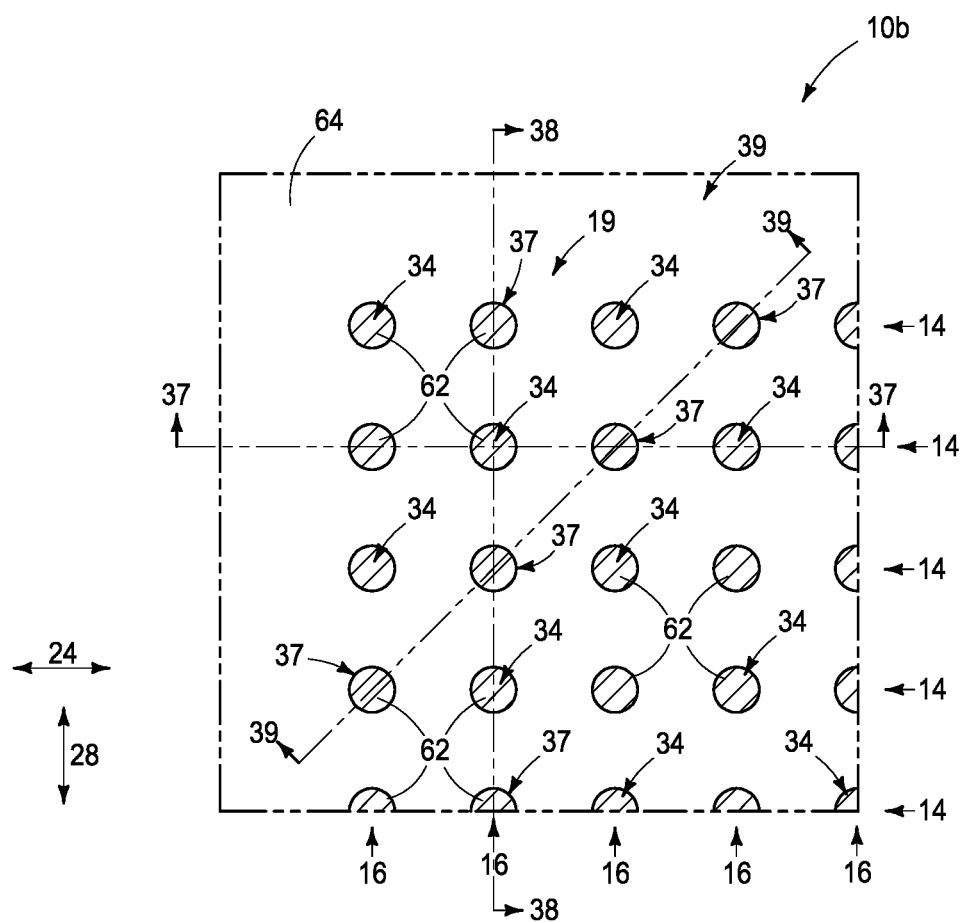
Figure 37:
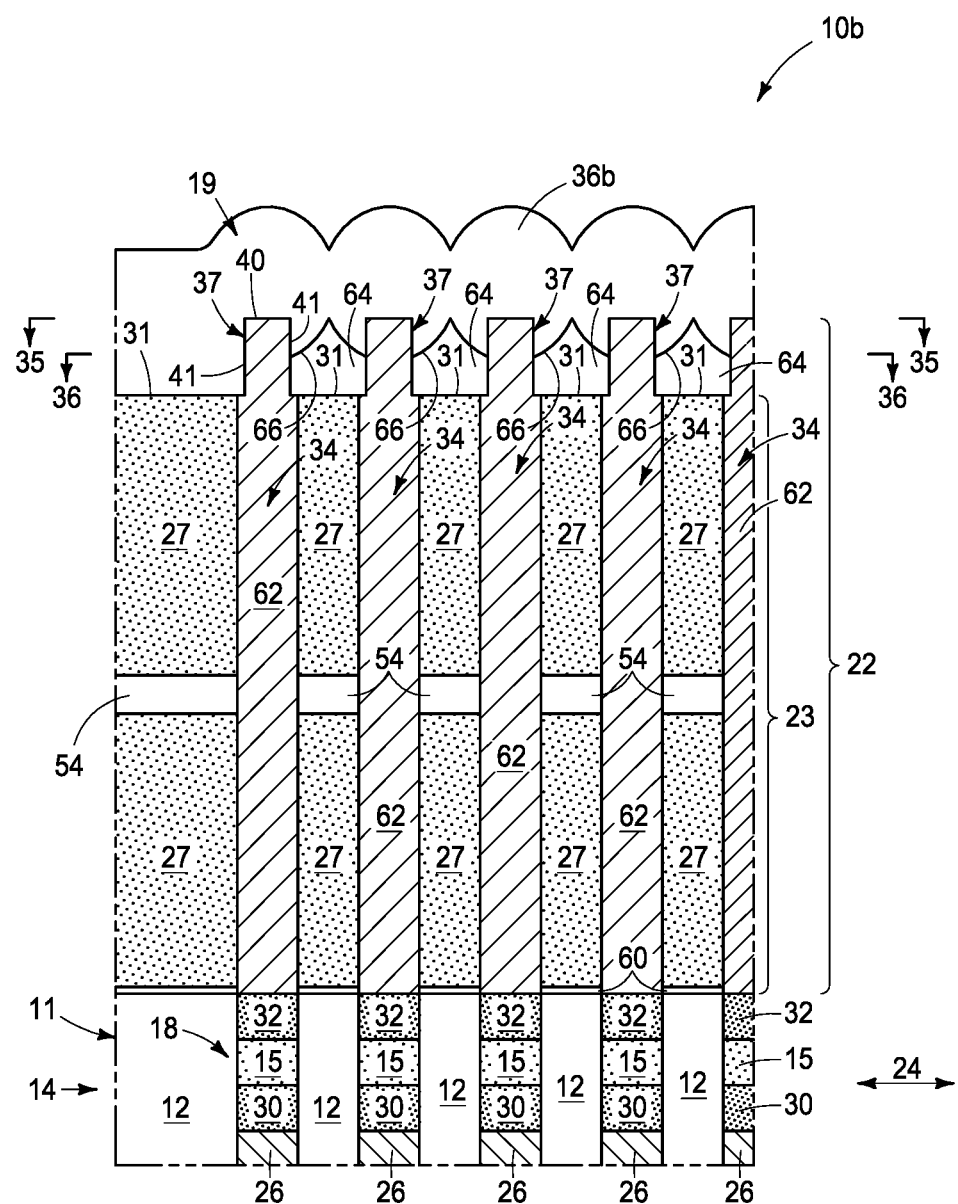
Figure 38:
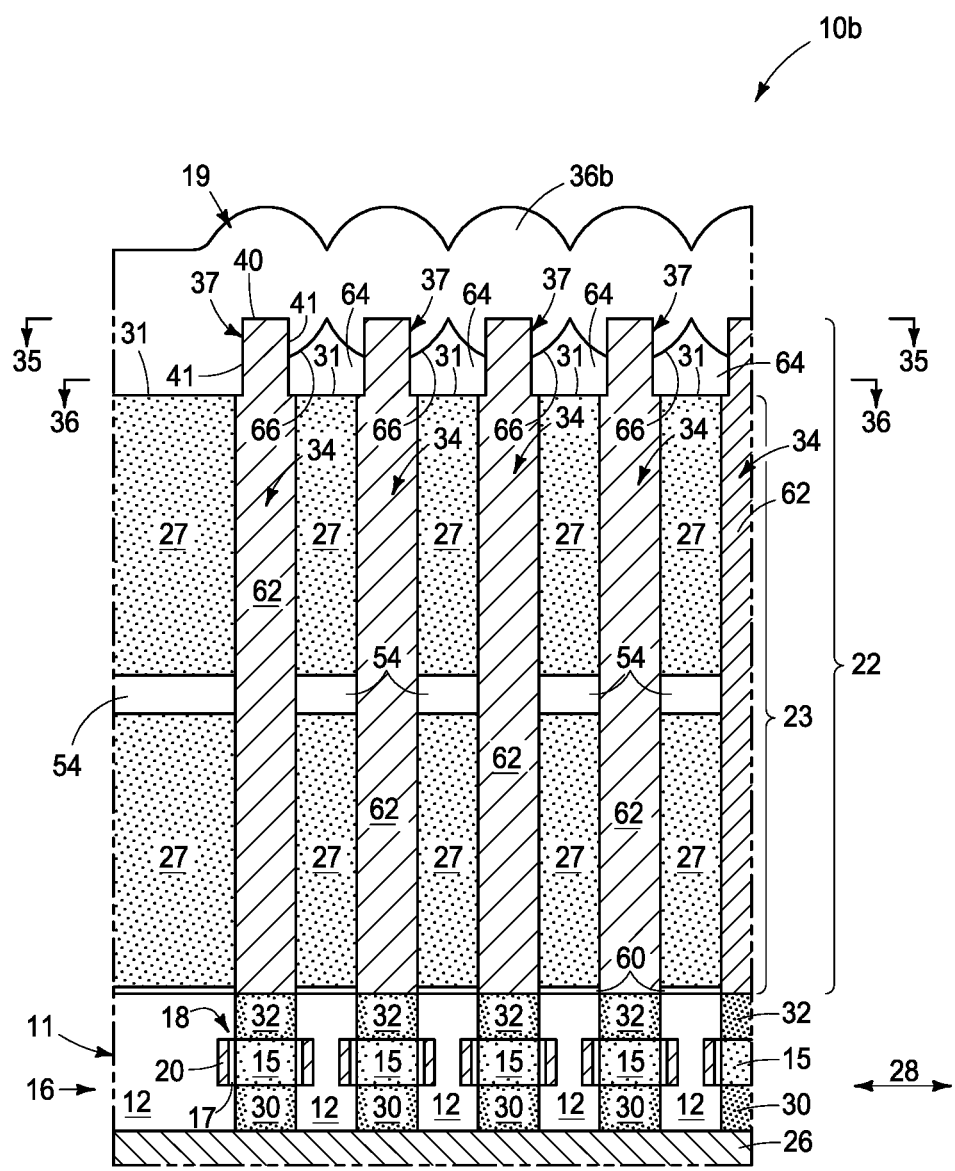
Figure 39:
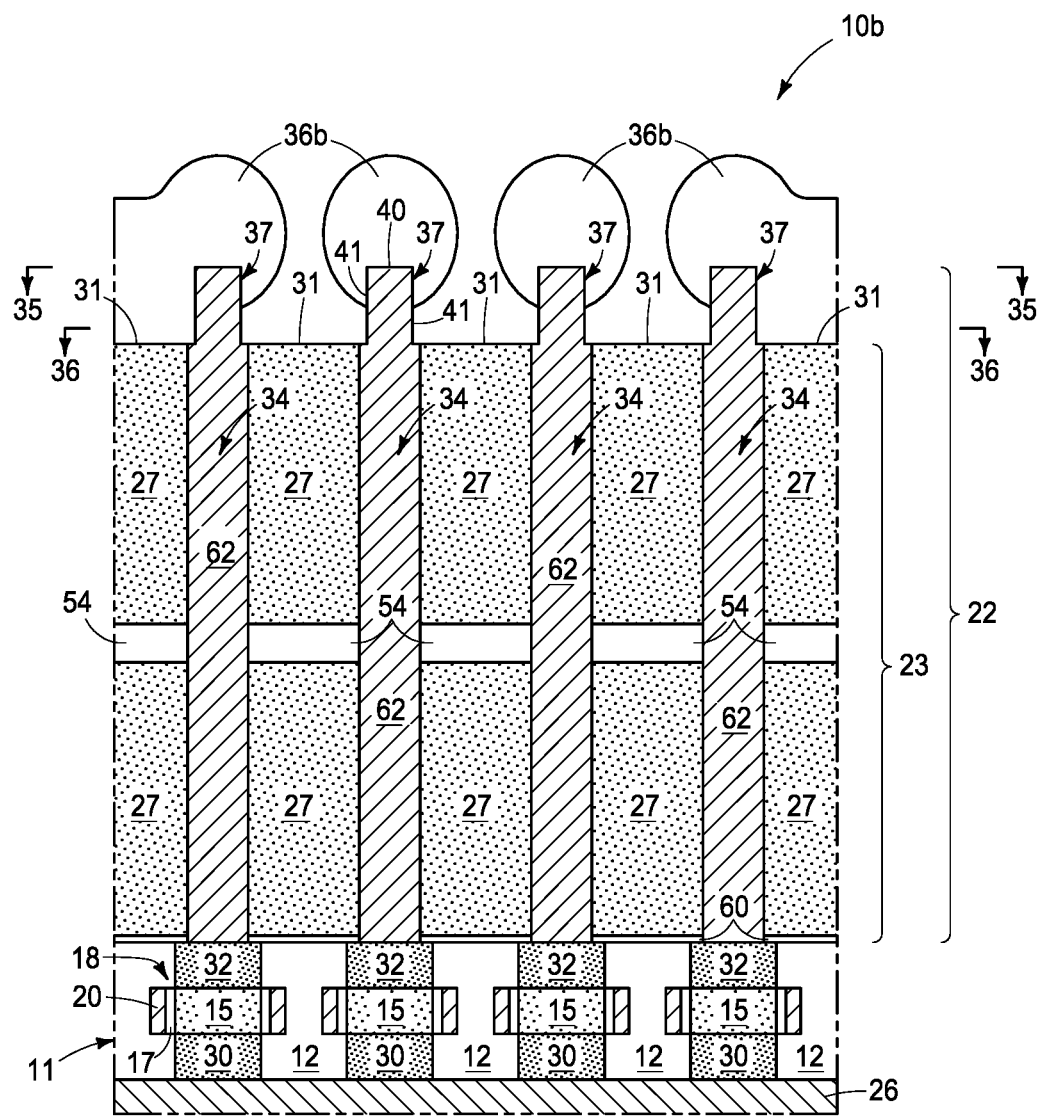
Figure 40:
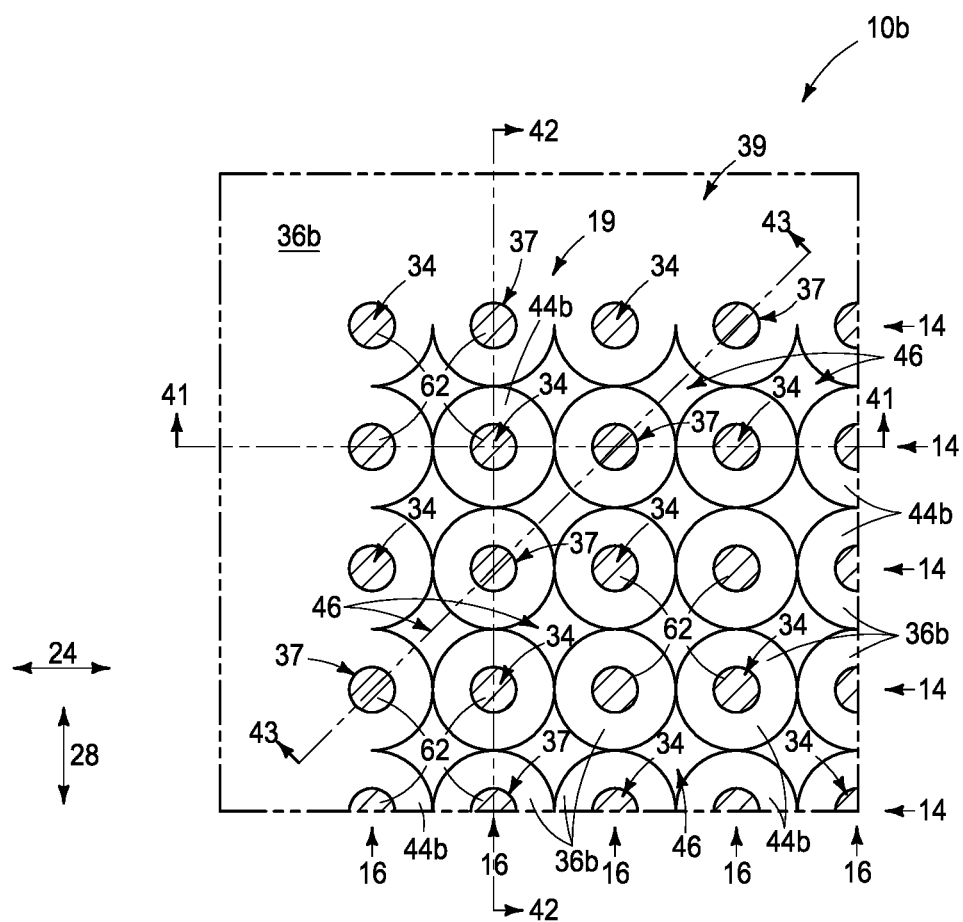
Figure 41:
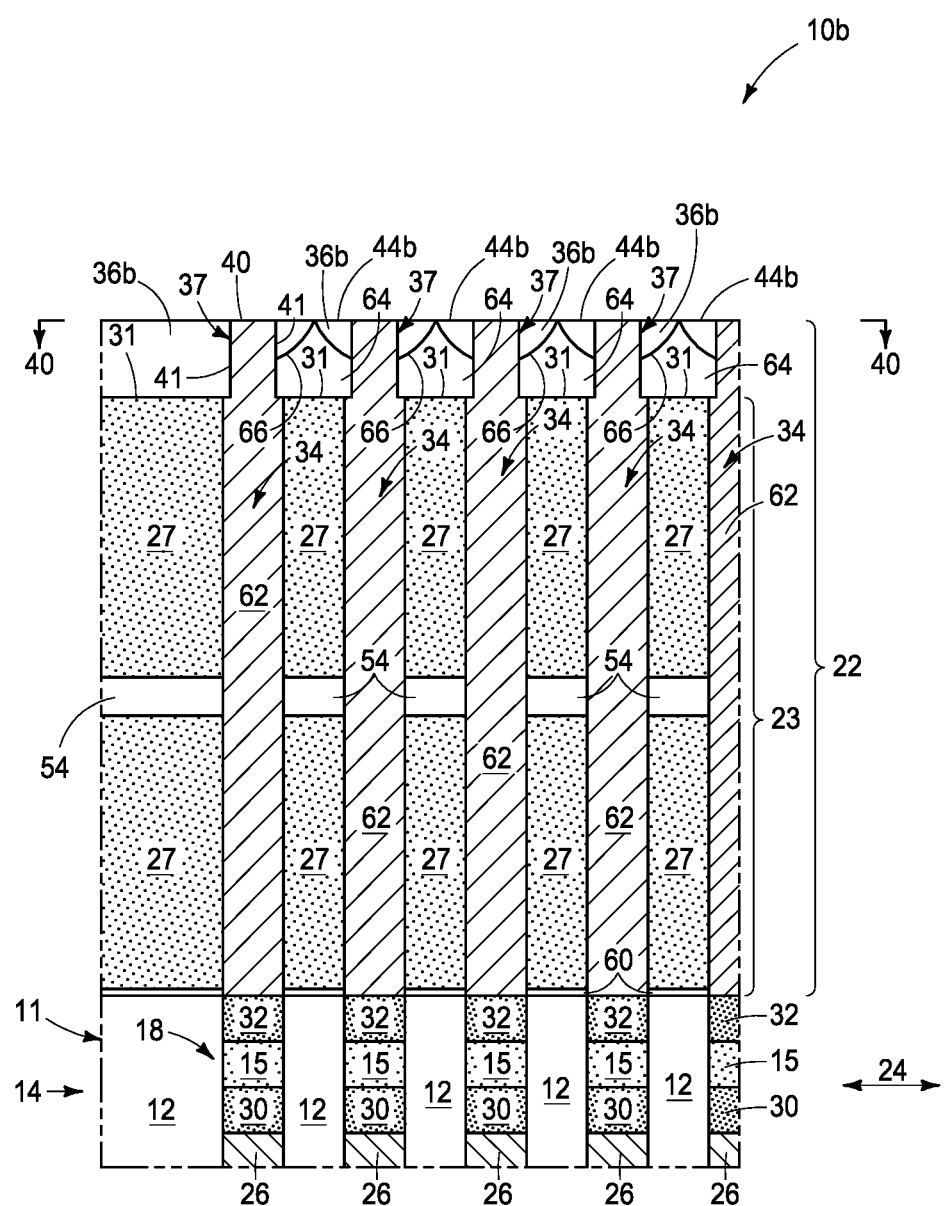
Figure 42:
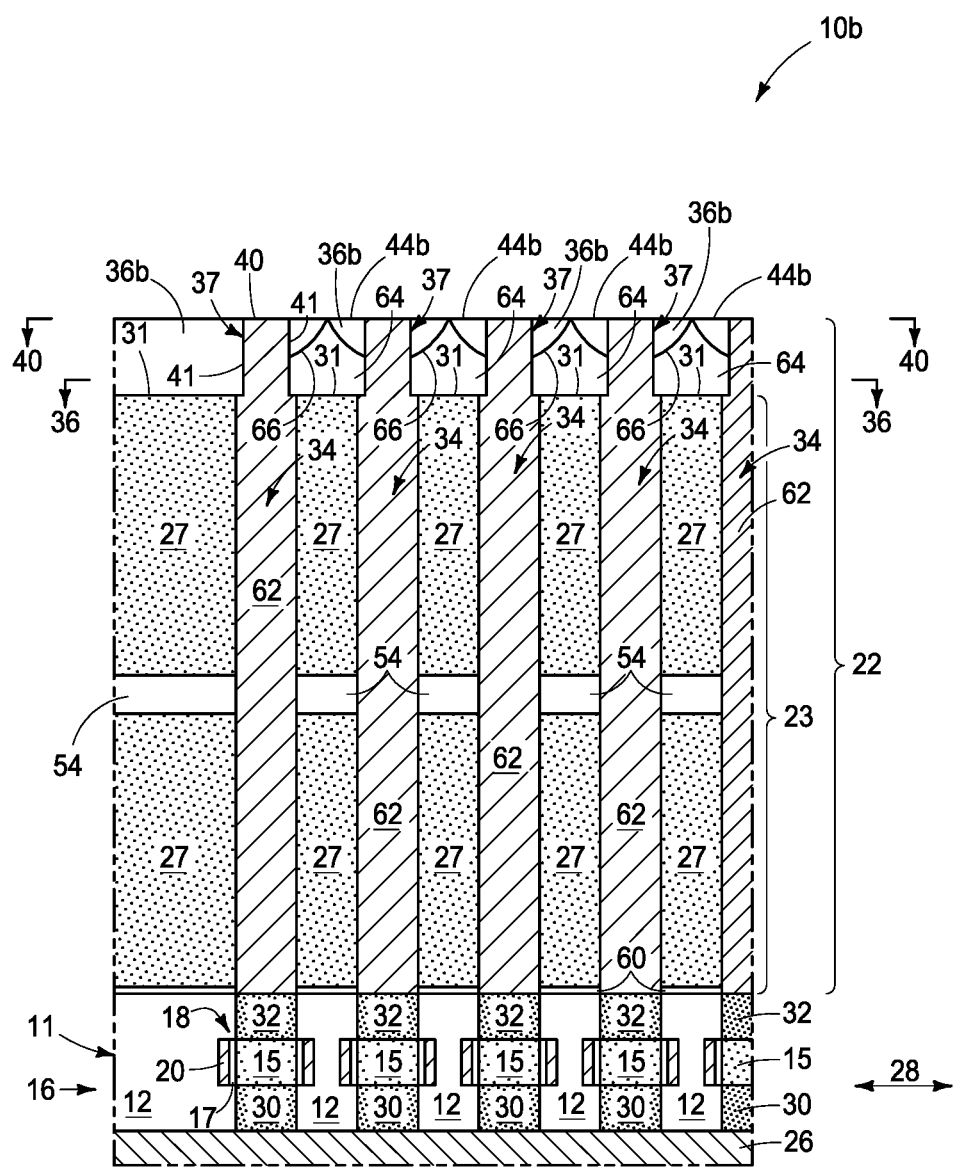
Figure 43:
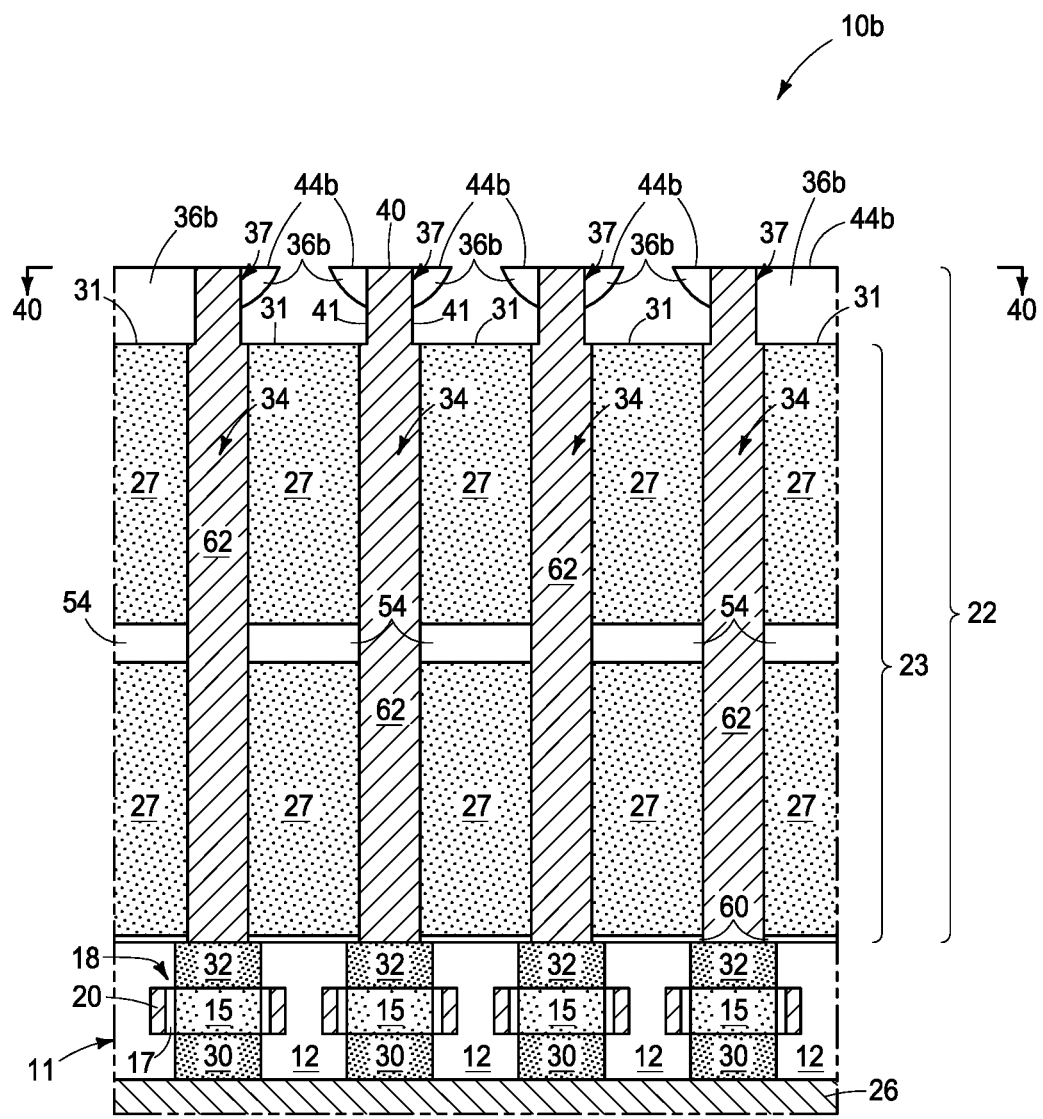

Regardless, FIG. 34 (same cross-sections as FIG. 18) shows an alternate example construction 10a. Like numerals from the above-described embodiments have been used where appropriate construction differences being indicated with the suffix "a" or with different numerals. In construction 10a, insulative rings 44 about immediately-adjacent first capacitor electrodes 34 are laterally directly against one another in a first straight-line direction 24. Insulative rings 44 about immediately-adjacent first capacitor electrodes 34 in a second straight-line direction 28 that is angled relative to first straight-line direction 24 are laterally-spaced from one another by opening/lateral space 46. In construction 10a, first straight-line direction 24 is angled at 90° from second straight-line direction 28. Further and regardless, FIG. 34 shows an embodiment wherein the vertically-elongated first capacitor electrodes are arrayed in a 21) hexagonal lattice. Any other attribute(s) or aspect(s) as shown and/or described herein with respect to other embodiments may be used.

The above two examples each show an insulative ring being formed circumferentially about individual vertically-projecting portions of the first capacitor electrodes, with the insulative rings about immediately-adjacent of the first capacitor electrodes in a first straight-line direction being laterally directly against one another and in a second straight-line direction that is angled relative to the first straight-line direction are laterally-spaced from one another. Angles other than 90° (FIG. 34) and 45° (FIG. 18) may be used. Any alternate or future-developed methods and constructions may be used.

An alternate embodiment method is next described with reference to FIGS. 35-45 with respect to a construction 10b. Like numerals from the above-described embodiments have been used where appropriate, with some construction differences being indicated with the suffix "b" or with different numerals. FIGS. 35-39 correspond in processing sequence to that of FIGS. 14-17 with respect to construction 10 described above. However, here, insulative material 36b has been formed over sidewalls of vertically-projecting portions 37 of first capacitor electrodes 34 whereby void space 64 is vertically between top 31 of sacrificial material 27 and a bottom 66 of insulative material 36b. The artisan is capable of choosing desired operating parameters to achieve, for example, a deposition of insulative material 36 or 36b as shown in either constructions 10 and 10b, respectively, for example by modifying temperature and/or pressure within a deposition chamber in which precursor feed gasses are provided in chemical vapor deposition of material 36 or 36b as shown. For example, lower pressure and/or lower temperature will tend towards a less conformal deposition for producing construction 10b, FIGS. 40-43 show subsequent processing wherein insulative material 36b has been removed back at least to tops of first capacitor electrodes 34.

Regardless, insulative material 36b comprises an insulative ring 44b circumferentially about individual vertically-projecting portions 37 of first capacitor electrodes 34. Insulative rings 44b about immediately-adjacent first capacitor electrodes 34 in a first straight-line direction (e.g., 24 or 28) are laterally directly against one another. Insulative rings 44b about immediately-adjacent first capacitor electrodes 34 in a second straight-line direction (e.g., 45) that is angled relative to the first straight-line direction are laterally-spaced from one another (e.g., by openings/lateral spaces 46).

Figure 44:
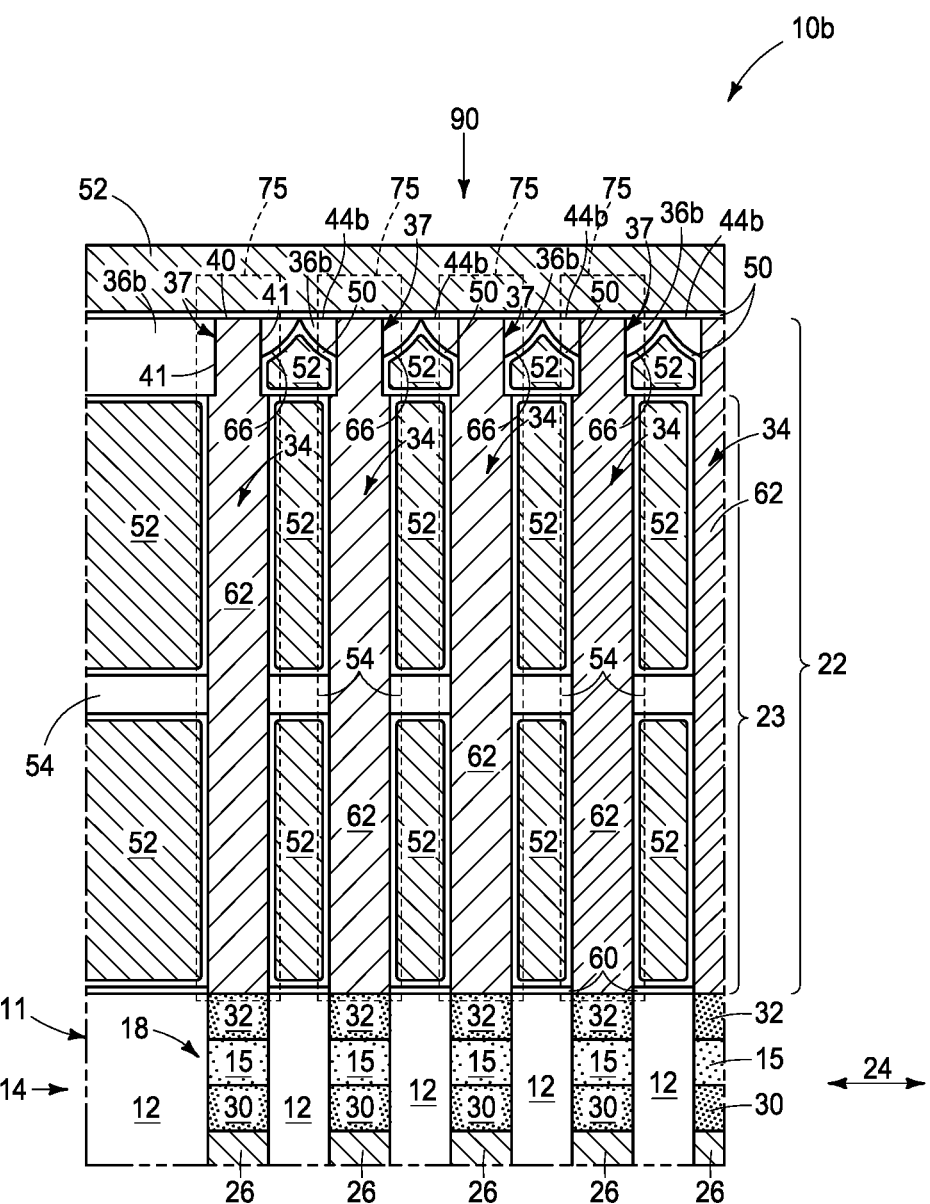
Figure 45:
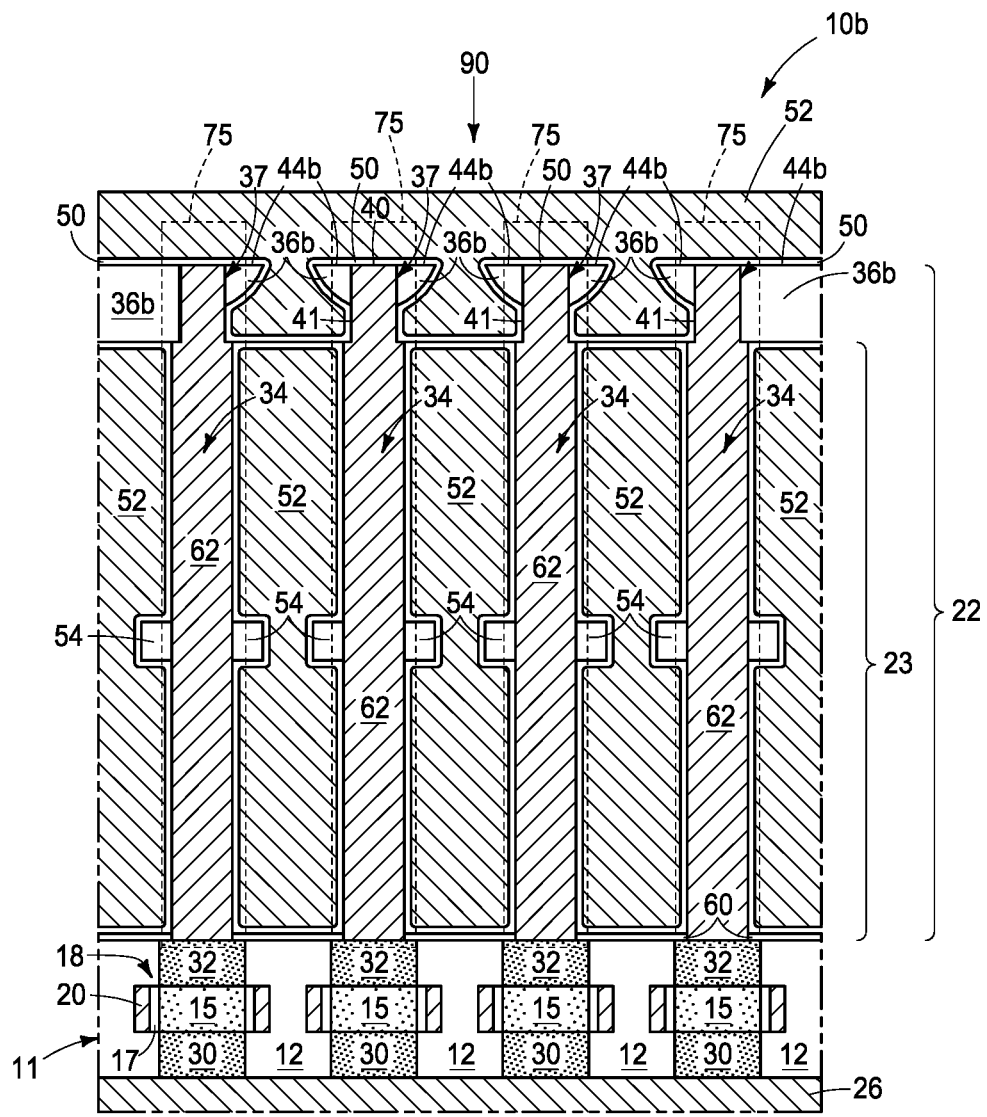

FIGS. 44 and 45 (same cross-sections as FIGS. 41 and 43, respectively) show construction 10b after example subsequent processing analogous to that described above with respect to FIGS. 22-33 (with second capacitor electrode 52 being continuous within array area 19 and not viewable in the cross-sections of FIGS. 44 and 45). Any other attribute (s) or aspect(s) as shown and/or described herein with respect to other embodiments may be used.

An alternate example construction 10c to that of construction 10b is next-described with reference to FIGS. 46-53. Like numerals from the above-described embodiments have been used where appropriate, with some construction differences being indicated with the suffix "c" or with different numerals.

Figure 46:
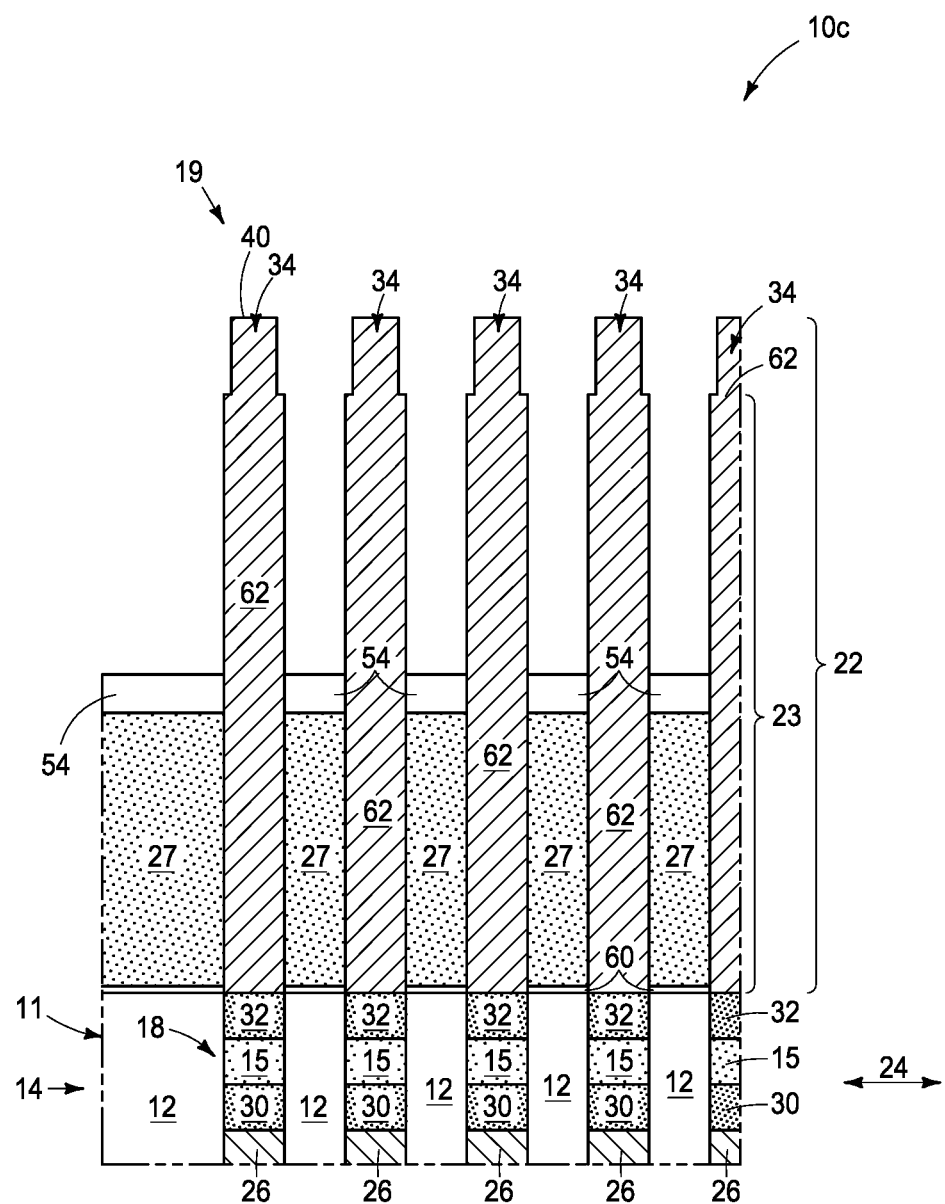
Figure 47:
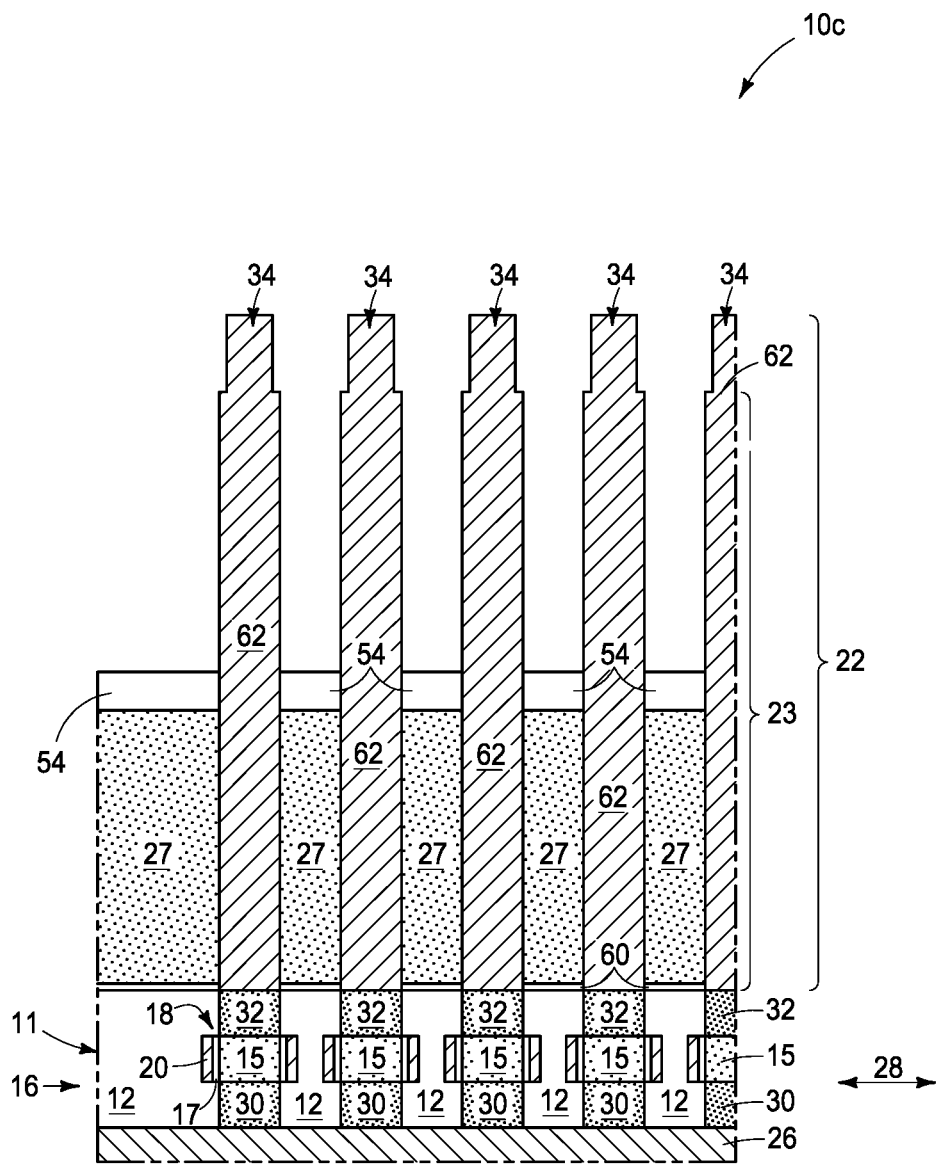
Figure 48:
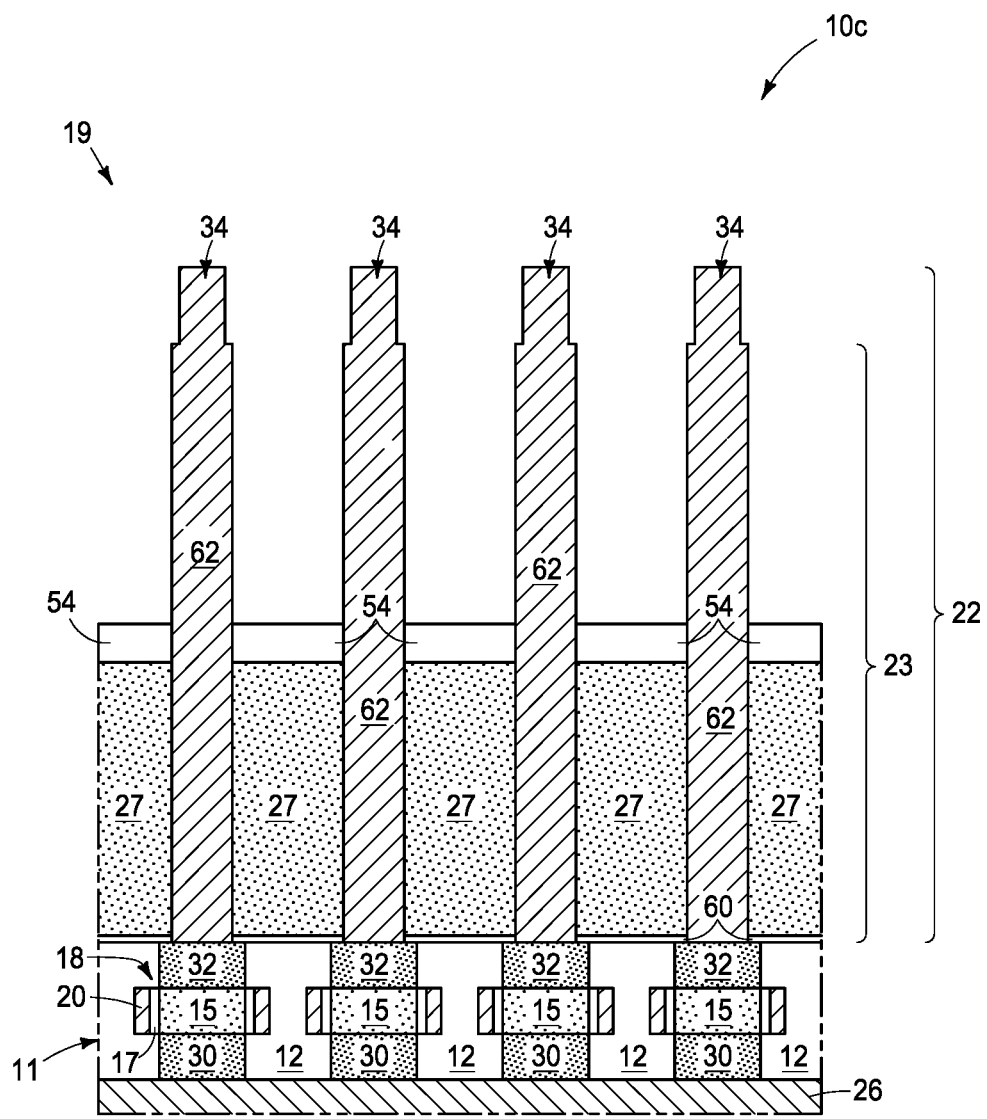
Figure 49:
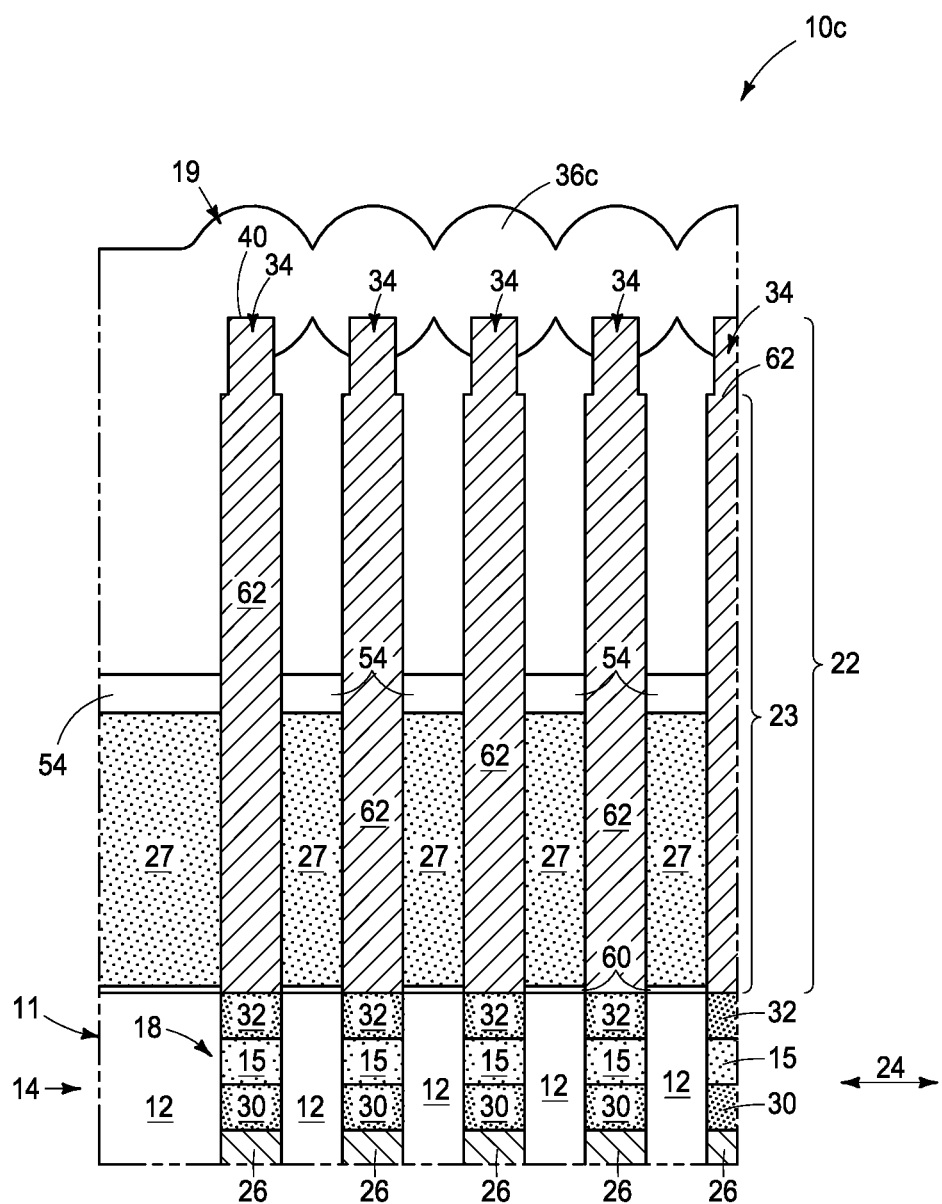

FIGS. 46-48 (same cross-sections as FIGS. 37-39, respectively) show processing immediately-subsequent to that shown by FIGS. 12 and 13 and immediately prior to that shown by FIGS. 35-39 above. Here, sacrificial material 27 has been removed from being directly above insulating material 54 before forming insulative material 36b (not-yet-shown).

Figure 50:
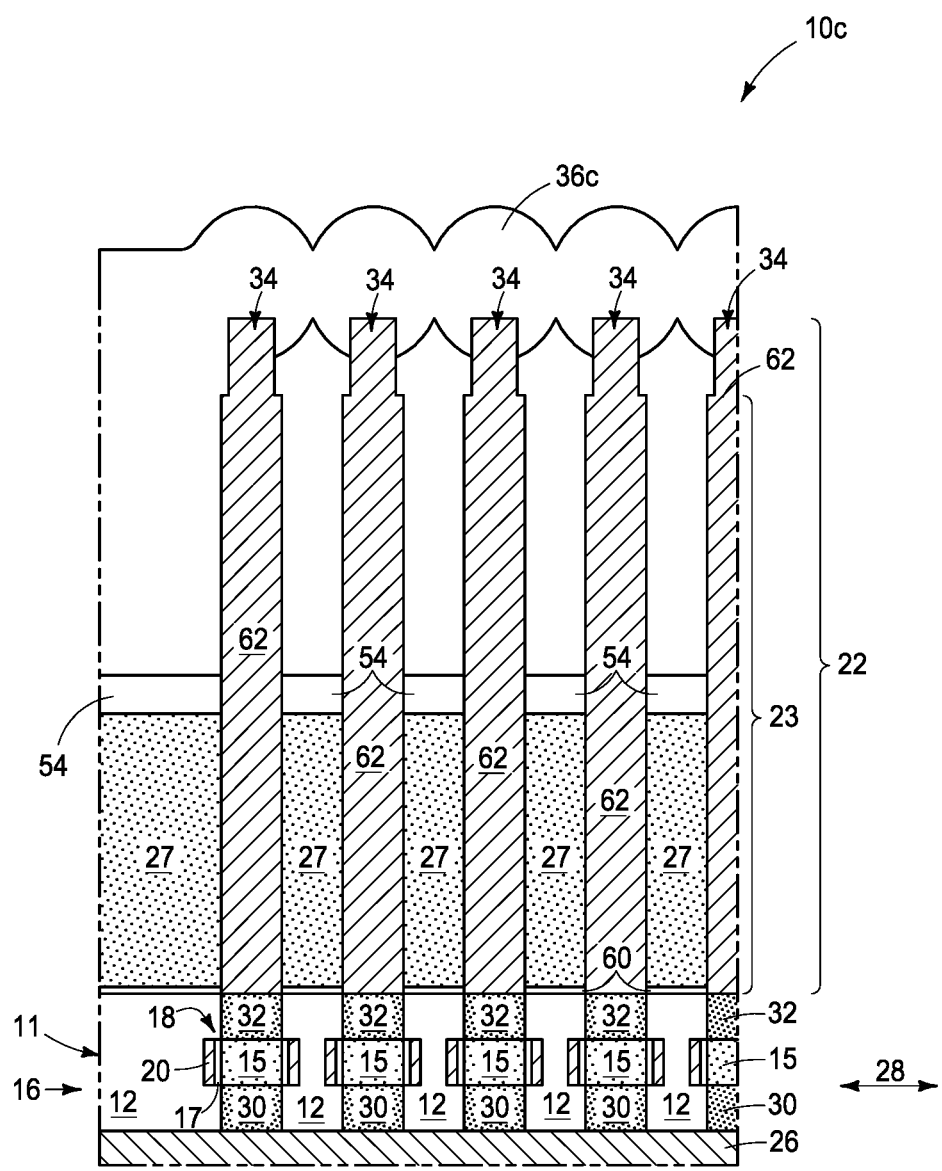
Figure 51:
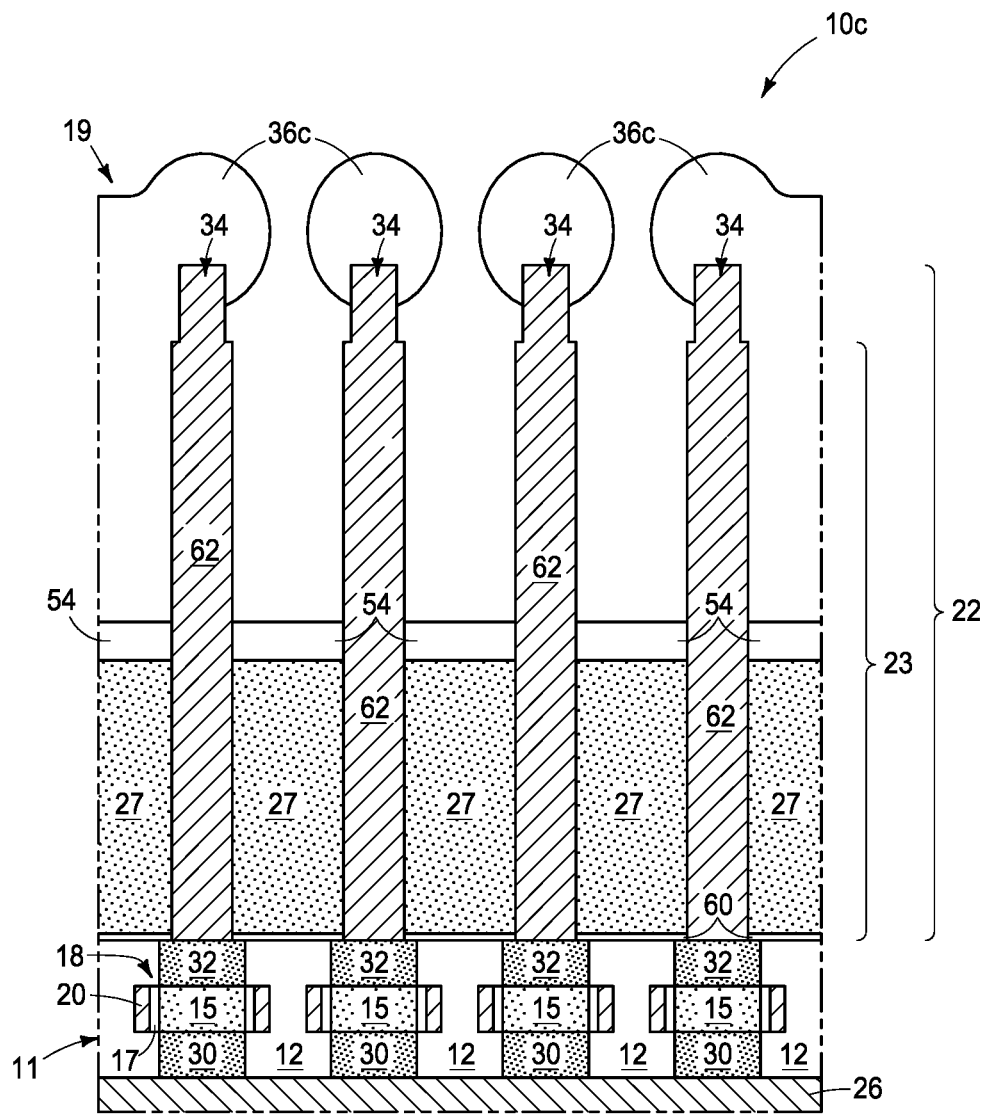
Figure 52:
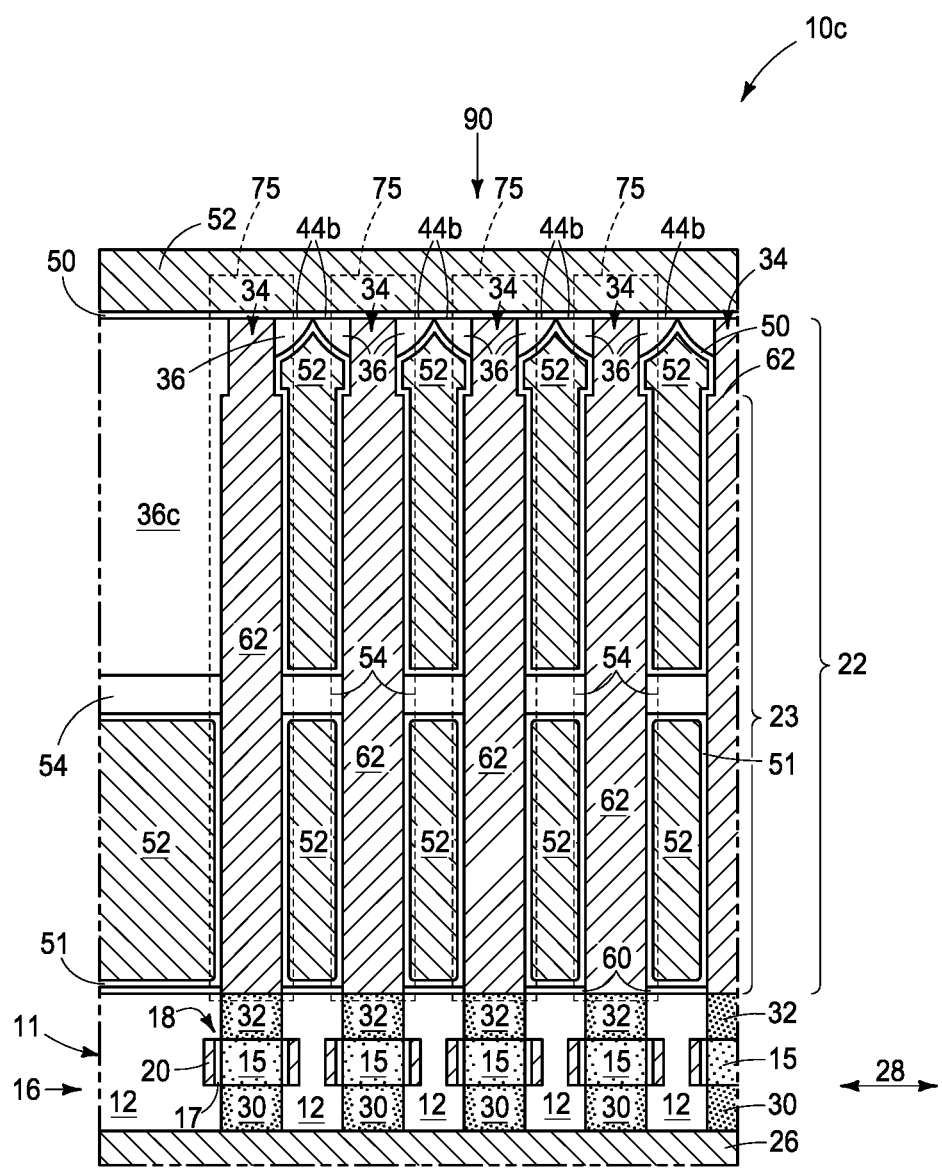
Figure 53:
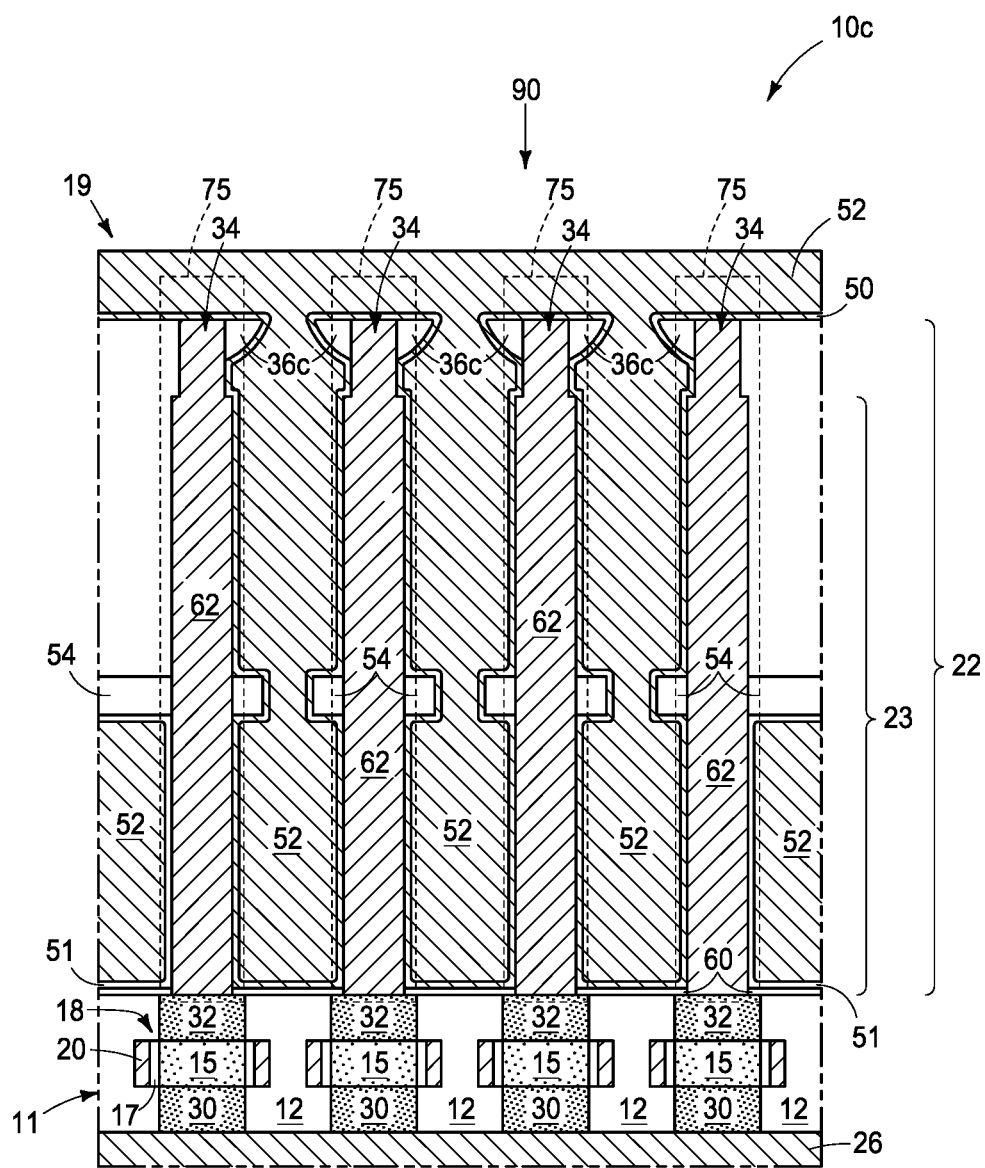

FIGS. 50 and 51 (same cross-sections as FIGS. 37 and 39, respectively) show subsequent processing corresponding to that described above with respect to FIGS. 40-43, FIGS. 52 and 53 (same cross-sections as FIGS. 44 and 45, respectively) show subsequent processing corresponding to that described above with respect to FIGS. 44 and 45.

Any other attribute(s) or aspect(s) as shown and/or described herein with respect to other embodiments may be used.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, an array (e.g., 90) of capacitors (e.g., 75) comprises a two-dimensional (2D) array of vertically-elongated first capacitor electrodes (e.g., 34). A layer of insulative support material (e.g., 36) is against sides (e.g., 41) of and supports (laterally) the first capacitor electrodes. The layer of the insulative support material comprises an insulative ring (e.g., 44, 44b) circumferentially about individual of the first capacitor electrodes. The insulative rings about immediately-adjacent of the first capacitor electrodes in a first straight-line direction are laterally directly against one another. The insulative rings about immediately-adjacent of the first capacitor electrodes in a second straight-line direction that is angled relative to the first straight-line direction are laterally-spaced from one another. A capacitor insulator (e.g., 50) is over the vertically-elongated first capacitor electrodes. At least one second capacitor electrode (e.g., 52) is over the capacitor insulator. Any other attribute (s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector.

In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials and/or regions are not homogenous. If the two stated materials or regions are not directly against one another, "different composition" only requires that those portions of the two stated materials or regions that are closest to one another be chemically and/or physically different if such materials or regions are not homogenous, in this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region (s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming an array of capacitors comprises forming an array of vertically-elongated first capacitor electrodes that project vertically relative to an outer surface. An insulative ring is formed circumferentially about individual vertically-projecting portions of the first capacitor electrodes. The insulative rings about immediately-adjacent of the first capacitor electrodes in a first straight-line direction are laterally directly against one another. The insulative rings about immediately-adjacent of the first capacitor electrodes in a second straight-line direction that is angled relative to the first straight-line direction are laterally-spaced from one another. A capacitor insulator is formed over sidewalls of the first capacitor electrodes. At least one second capacitor electrode is formed over the capacitor insulator.

In some embodiments, a method used in forming an array of capacitors comprises forming an array of vertically-elongated first capacitor electrodes through the sacrificial material. The first capacitor electrodes project vertically relative to the sacrificial material. Insulative material is formed against tops and sidewalls of vertically-projecting portions of the first capacitor electrodes and against a top of the sacrificial material that is laterally-among the first capacitor electrodes. The insulative material is horizontally-continuous within and less-than-fills void space that is laterally-among the vertically-projecting portions of the first capacitor electrodes. The insulative material is etched to remove it from being horizontally-continuous within the void space to form an insulative ring circumferentially about individual of the vertically-projecting portions of the first capacitor electrodes. The insulative rings about immediately-adjacent of the first capacitor electrodes in a first straight-line direction are laterally directly against one another. The insulative rings about immediately-adjacent of the first capacitor electrodes in a second straight-line direction that is angled relative to the first straight-line direction are laterally-spaced from one another by an opening through the insulative material. The sacrificial material is etched through the openings that are individually laterally-between the immediately-adjacent first capacitor electrodes along the second straight-line direction. A capacitor insulator is formed over sidewalls of the first capacitor electrodes. At least one second capacitor electrode is formed over the capacitor insulator.

In some embodiments, a method used in forming an array of capacitors comprises forming an array of vertically-elongated first capacitor electrodes that project vertically relative to an outer surface within an array area. Insulative material is formed over sidewalls of vertically-projecting portions of the first capacitor electrodes. Void space is vertically between a top of the sacrificial material and a bottom of the insulative material within the array area. The insulative material comprises an insulative ring circumferentially about the individual vertically-projecting portions of the first capacitor electrodes. The insulative rings about immediately-adjacent of the first capacitor electrodes in a first straight-line direction are laterally directly against one another. The insulative rings about immediately-adjacent of the first capacitor electrodes in a second straight-line direction that is angled relative to the first straight-line direction are laterally-spaced from one another. A capacitor insulator is formed over sidewalls of the first capacitor electrodes. At least one second capacitor electrode is formed over the capacitor insulator.

In some embodiments, an array of capacitors comprises a two-dimensional (2D) array of vertically-elongated first capacitor electrodes. A layer of insulative support material is against sides of and support the first capacitor electrodes. The layer of the insulative support material comprises an insulative ring circumferentially about individual of the first capacitor electrodes. The insulative rings about immediately-adjacent of the first capacitor electrodes in a first straight-line direction are laterally directly against one another. The insulative rings about immediately-adjacent of the first capacitor electrodes in a second straight-line direction that is angled relative to the first straight-line direction are laterally-spaced from one another. A capacitor insulator is over the vertically-elongated first capacitor electrodes. At least one second capacitor electrode is over the capacitor insulator.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. An array of capacitors comprising:
   a two-dimensional (2D) array of vertically-elongated first capacitor electrodes, each of the vertically-elongated first capacitor electrodes being a solid pillar of conductive material extending vertically relative to a horizontal surface of a base substrate and having an overall vertical height extending from an uppermost surface of the solid pillar to a bottom surface of the solid pillar and having an upper portion over a lower portion, the upper portion extending from the uppermost surface to the lower portion and having a first diameter along an entirety of the upper portion, the lower portion extending to the bottom surface and having a second diameter along an entirety of the lower portion, the second diameter being greater than the first diameter;
   a layer of insulative support material against sides of the upper portion and supporting the vertically-elongated first capacitor electrodes in a horizontal cross-section, the layer of the insulative support material comprising a completely-encircling insulative ring that completely encircles around the upper portion of individual of the vertically-elongated first capacitor electrodes in the horizontal cross-section, first immediately-adjacent ones of the completely-encircling insulative rings in a first straight-line direction being laterally directly against one another in the horizontal cross-section, second immediately-adjacent ones of the completely-encircling insulative rings in a second straight-line direction that is angled relative to the first straight-line direction being laterally-spaced from one another in the horizontal cross-section;
   a capacitor insulator over the vertically-elongated first capacitor electrodes; and
   at least one second capacitor electrode over the capacitor insulator.

2. The array of claim 1 wherein the capacitor insulator is over tops and bottoms of all of the completely-encircling insulative rings.

3. The array of claim 1 wherein the at least one second capacitor electrode is over tops and bottoms of all of the completely-encircling insulative rings.

4. The array of claim 1 wherein:
   the capacitor insulator is over tops and bottoms of all of the completely-encircling insulative rings; and
   the at least one second capacitor electrode is over the tops and the bottoms of all of the completely-encircling insulative rings.

5. The array of claim 1 wherein the first and second straight-line directions are angled 45° from one another.

6. The array of claim 1 wherein the first and second straight-line directions are angled 90° from one another.

7. The array of claim 1 wherein the vertically-elongated first capacitor electrodes are arrayed in a 2D lattice having a parallelogram unit cell, the second straight-line direction being along a diagonal of the parallelogram unit cell.

8. The array of claim 1 wherein the vertically-elongated first capacitor electrodes are arrayed in a 2D hexagonal lattice.

9. The array of claim 1 wherein the array of capacitors is at least part of an array of memory cells, individual of the capacitors comprising at least part of individual memory cells of the array of memory cells.

10. The array of claim 9 wherein the array of memory cells comprises DRAM integrated circuitry.

11. The array of claim 1 wherein the completely-encircling insulative rings have a curved bottom in a vertical cross-section.

12. An array of capacitors comprising:
    a two-dimensional (2D) array of vertically-elongated first capacitor electrodes;
    a layer of insulative support material against sides of and supporting the first capacitor electrodes in a first horizontal cross-section, the layer of the insulative support material comprising a completely-encircling insulative ring that completely encircles around individual of the first capacitor electrodes in the first horizontal cross-section, first immediately-adjacent ones of the completely-encircling insulative rings in a first straight-line direction being laterally directly against one another in the first horizontal cross-section, second immediately-adjacent ones of the completely-encircling insulative rings in a second straight-line direction that is angled relative to the first straight-line direction being laterally-spaced from one another in the first horizontal cross-section;
a lower insulative ring encircling each of the individual first capacitor electrodes, the lower insulative ring being disposed vertically beneath the completely-encircling insulative rings, the lower insulative ring being spaced from immediately adjacent lower insulative rings along the second straight-line direction in a second horizontal cross-section;
a capacitor insulator over the first and second immediately-adjacent ones of the vertically-elongated first capacitor electrodes;
a common second capacitor electrode over the capacitor insulator that is common to a plurality of the capacitors; and
the first capacitor electrodes being arrayed in rows and columns of a 2-dimensional lattice having a parallelogram unit cell, the second straight-line direction being along a diagonal of the parallelogram unit cell, immediately-adjacent of the rows having a lateral space there-between and that is laterally between each and every one of two immediately-laterally-adjacent of the first capacitor electrodes in each of the rows, the capacitor insulator and the common second capacitor electrode completely filling the lateral space.

13. An array of capacitors comprising:
a two-dimensional (2D) array of vertically-elongated first capacitor electrodes, each of the vertically-elongated first capacitor electrodes extending vertically over a horizontal surface of a substrate and having a lower portion extending from a bottommost surface of the vertically-elongated first capacitor electrodes and an upper portion extending from an uppermost surface of the vertically-elongated electrode to the lower portion, the lower portion having a first diameter and an entirety of the upper portion having a second diameter that is less than the first diameter;
a layer of insulative support material against sides of the upper portion and supporting the first capacitor electrodes in a first horizontal cross-section, the layer of the insulative support material being configured as a completely-encircling insulative ring that completely encircles around the upper portion of individual of the first capacitor electrodes in the first horizontal cross-section, first immediately-adjacent ones of the completely-encircling insulative rings in a first straight-line direction being laterally directly against one another in the first horizontal cross-section, second immediately-adjacent ones of the completely-encircling insulative rings in a second straight-line direction that is angled relative to the first straight-line direction being laterally-spaced from one another in the first horizontal cross-section;
a lower insulative ring encircling the individual of the first capacitor electrodes along the lower portion, the lower insulative ring being spaced from immediately adjacent lower insulative rings along the second straight-line direction in a second horizontal cross-section;
a capacitor insulator over the first and second immediately-adjacent ones of the vertically-elongated first capacitor electrodes;
a common second capacitor electrode over the capacitor insulator that is common to a plurality of the capacitors;
the first capacitor electrodes being arrayed in rows and columns of a 2-dimensional hexagonal lattice, immediately-adjacent of the rows having their first capacitor electrodes laterally offset relative one another, a lateral space between the immediately-adjacent rows and laterally between each and every one of two immediately-laterally-adjacent of the first capacitor electrodes in each of the rows, the capacitor insulator and the common second capacitor electrode completely filling the lateral space.

* * * * *